(12) United States Patent
Nii

(10) Patent No.: US 7,023,247 B2
(45) Date of Patent: Apr. 4, 2006

(54) SEMICONDUCTOR DEVICE HAVING CMOS DRIVER CIRCUIT

(75) Inventor: Koji Nii, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 136 days.

(21) Appl. No.: 10/612,364

(22) Filed: Jul. 3, 2003

(65) Prior Publication Data

US 2006/0001458 A1    Jan. 5, 2006

(30) Foreign Application Priority Data

Jul. 15, 2002  (JP)  ............................. 2002-205391
Mar. 27, 2003  (JP)  ............................. 2003-088261

(51) Int. Cl.
*H03B 1/00* (2006.01)

(52) U.S. Cl. ...................... 327/112; 327/170; 327/391; 326/26; 326/83

(58) Field of Classification Search ........ 327/108–112, 327/170, 333, 379, 389, 391, 374, 376, 377; 326/26, 27, 82, 83, 87, 81
See application file for complete search history.

(56) References Cited

U.S. PATENT DOCUMENTS 5,122,690 A * 6/1992 Bianchi ..................... 326/87
5,166,555 A * 11/1992 Kano ........................... 326/87
6,166,580 A * 12/2000 Sessions ..................... 327/333
6,388,504 B1   5/2002 Goto et al. .................. 327/534

FOREIGN PATENT DOCUMENTS

| JP | 05-002893 | 1/1993 |
| JP | 7-273631 | 10/1995 |
| JP | 8-274606 | 10/1996 |
| JP | 2000-183716 | 6/2000 |
| JP | 2001-156260 | 6/2001 |
| KR | 1997-0055512 | 7/1997 |

OTHER PUBLICATIONS

Weste et al, Principles of CMOS VLSI Design: A SystemsPerspective, 1993, Addison-Wesley, 2$^{nd}$ Edition, pp. 13-15.*

* cited by examiner

*Primary Examiner*—Long Nguyen
(74) *Attorney, Agent, or Firm*—Leydig, Voit & Mayer, Ltd.

(57) ABSTRACT

Voltages of nodes are controlled in accordance with an input signal using inverters. A voltage level of a transistor is adjusted using a transistor included in the inverter. By setting a gate voltage supplied to a gate of the transistor lower than a power supply voltage and higher than an ON-state voltage, gate leakage current of the transistor can be greatly decreased.

8 Claims, 32 Drawing Sheets

SEMICONDUCTOR DEVICE HAVING CMOS DRIVER CIRCUIT

BACKGROUND OF THE INVENTION

1. Field of the Invention

The present invention particularly relates to a semiconductor device having a CMOS driver circuit.

2. Description of the Background Art

In recent years, semiconductor devices each including a plurality of processing circuits have been produced as one-chip microcomputers and these semiconductor devices have been utilized for electronic circuit equipment or the like of, for example, cellular phones. While a portable equipment such as a cellular phone necessarily employs a battery as a power supply, the battery is made small in size and light in weight to satisfy the demand to do so.

Since it is demanded to employ the battery for long time besides such a demand for making the battery small in size and light in weight, it is strongly demanded to decrease the power consumption of the battery. On the other hand, for a digital cellular phone or the like, it is further demanded to accelerate the semiconductor device so as to digitally process a voice signal at real time.

In order to meet these various demands, normally, a signal processing section in a circuit is constituted out of transistors each of which has a low current driving force to propagate processed signals to an internal circuit and a circuit, which outputs signals to the outside, employs a driver circuit consisting of transistors each having a high current driving force.

FIG. 31 is a circuit block diagram of a conventional CMOS driver circuit which propagates an input signal. In the following description, the CMOS driver circuit will be also referred to as simply "driver circuit".

Referring to FIG. 31, the conventional CMOS driver circuit includes two inverters INV0 and INV1 which are connected in series. Inverter INV0 includes transistors PT0 and NT0. Transistor PT0 is arranged between a power supply voltage VDD and a node Na and the gate thereof is connected to an input node to receive the input of an input signal IN. Transistor NT0 is arranged between node Na and a ground voltage GND and the gate thereof receives the input of input signal IN.

Inverter INV1 includes transistors PT1 and NT1. Transistor PT1 is arranged between power supply voltage VDD and an output node and the gate thereof is connected to node Na. Transistor NT1 is arranged between the output node and ground voltage GND and the gate thereof is connected to node Na. It is noted that transistors PT0 and PT1 are P-channel MOS transistors and transistors NT0 and NT1 are N-channel MOS transistors.

Further, inverter INV1 outputs a signal transmitted to the output node as an output signal OUT.

In the following description, the input node from which input signal IN is received is also denoted by reference symbol IN and the output node from which output signal OUT is driven is also denoted by reference symbol OUT.

Referring to a timing chart shown in FIG. 32, the operation of the conventional CMOS driver circuit will be described. In the following, it is assumed that power supply voltage VDD is 1 V and ground voltage GND is 0 V by way of one example. In addition, it is assumed that high voltage level (power supply voltage VDD: 1 V) is "H" level and low voltage level (ground voltage GND: 0 V) is "L" level.

In an initial state, it is assumed that input signal IN is 0 V. In this case, transistor PT0 of inverter INV0 is turned on to thereby electrically couple power supply voltage VDD to node Na. Therefore, the voltage level of node Na is set at 1 V. In addition, transistor NT1 of inverter INV1 is turned on in response to the voltage level of node Na to thereby electrically couple ground voltage GND to the output node. Therefore, the voltage level of the output node is set at 0 V.

If input signal IN changes from 0 V to 1 V at time T1, transistor PT0 is turned off and transistor NT0 is turned on in inverter INV0. In response to this, ground voltage GND is electrically coupled to node Na and the voltage level of node Na is set at 0 V. In inverter INV1, transistor PT1 is turned on in response to the voltage level of node Na to thereby electrically couple power supply voltage VDD to the output node. Therefore, the voltage level of the output node is set at 1 V. Output signal OUT rises at time T1a after the elapse of the transistor operation delay time since time T1 and set at 1 V.

If input signal IN changes from 1 V to 0 V at time T2, transistor NT0 of inverter INV0 is turned off and transistor PT0 thereof is turned on. In response to this, power supply voltage VDD is electrically coupled to node Na and the voltage level of node Na is set at 1 V. In addition, in response to the voltage level of node Na, transistor PT1 of inverter INV1 is turned off and transistor NT1 thereof is turned on. As a result, the output node is electrically coupled to ground voltage GND and the voltage level of the output node is set at 0 V.

As described above, in the CMOS driver circuit, output signal OUT is propagated as the level of input signal IN changes from "L" level to "H" level or from "H" level to "L" level.

The output node is normally electrically connected to a circuit in the next stage and a parasitic capacitance, a resistance or the like caused by the input capacitance and wirings of the circuit in the next stage becomes output load. In order to propagate output signal OUT at high rate in response to input signal IN, it is necessary to accelerate the operation rates of transistors PT1 and NT1 which constitute inverter INV1 in an output stage. Specifically, the channel widths of transistors PT1 and NT1 which constitute inverter INV1 in an output stage are set larger than those of transistors PT0 and NT0 which constitute inverter INV0 in the first stage to thereby accelerate signal propagation rate. If the gate length of each transistor is, for example, 0.1 μm, the gate widths of transistors PT0, NT0, PT1 and NT1 are set at approximately 2 μm, 1 μm, 10 μm and 5 μm, respectively.

As described above, the conventional CMOS driver circuit is normally constituted to accelerate signal propagation rate by setting the gate width of the inverter in the output stage which constitutes the driver circuit large.

However, as transistor microfabrication technique advances, a gate oxide film becomes thinner and a so-called gate leak current which is carried from a gate to a source or a drain or a substrate disadvantageously increases.

FIG. 33 shows the relationship between the thickness of a gate oxide film and gate leak current per transistor. Namely, FIG. 33 is a leak current characteristic view of a transistor which is set to have a gate length of 0.1 μm and a gate width of 10 μm.

In FIG. 33, the horizontal axis indicates the thickness of the gate oxide film and the vertical axis indicates the gate leak current (unit A: ampere) per transistor.

The gate leak current shown herein means a current which leaks from a gate terminal to a source, a drain and a substrate terminal if power supply voltage VDD is connected to the gate terminal and ground voltage GND is connected to each of the source, the drain and the substrate terminal for the N-channel MOS transistor. For the P-channel MOS transistor, the gate leak current means a current which leaks from a source, a drain and a substrate terminal to a gate terminal if ground voltage GND is connected to a gate terminal and power supply voltage VDD is connected to each of the source, the drain and the substrate terminal.

In a generation in which a transistor has a gate length of approximately 0.18 µm, the thickness of the gate oxide film of the transistor is approximately 260 nm. Gate leak current will now be considered in a case where the gate width is set at 1 µm.

The gate leak current shown in FIG. 33 is almost proportional to a gate area. For example, if the thickness of the gate oxide film is approximately 260 nm, the gate length is 0.1 µm and the gate width is 10 µm, the gate leak current of the transistor is about 1E−14 (A). It is assumed that 1E−14 indicates —$14^{th}$ power of 1×10. This applies hereafter. In this case, if the gate length is 0.18 µm and gate width is 1 µm, a gate leak current per transistor is about 1.8E−15 (A).

On the other hand, a sub-threshold leak current which is carried between the source and the drain if the transistor is in a standby state is about 1E−12 (A) under the same setting conditions as those described above. Therefore, the sub-threshold leak current is far higher than the gate leak current and it is unnecessary to consider the quantity of the gate leak current in the generation in which the transistor has a gate length of approximately 0.18 µm.

Recently, however, as the microfabrication technique has developed and demand for acceleration of operation rate has been rising, the thickness of a gate oxide film decreases and the gate leak current cannot be ignored. For example, in the generation of a gate length of 0.1 µm, the gate oxide film is set to have a thickness of approximately 200 nm.

Referring to FIG. 33, if the gate width is 10 µm, the gate leak current of the transistor is calculated as approximately 1E−11 (A). If the transistor is designed to have a gate length of 0.1 µm and a gate width of 1 µm, the gate leak current is calculated as approximately 1E−12 (A). Therefore, the leak current which is almost equal to the sub-threshold leak current flows and cannot be ignored. In this way, as the gate leak current of a transistor increases following the development of the microfabrication technique, the power consumption of the entire circuit disadvantageously increases.

Further, as already described above, the gate leak current is proportional to the gate area of a transistor. As a result, the gate leak current increases particularly in a transistor employed in the final stage of a driver current and having a larger gate width.

In order to decrease such a leak current, Japanese Patent Laying-Open No. 2001-156260 discloses a method for stopping power supply and thereby suppressing a leak current if a circuit, in which transistors having different gate oxide film thicknesses are provided, the gate oxide film of each transistor is small and the gate leak current is high, is inoperative. However, according to this method, it is necessary to provide a constitution for controlling the supply of power in accordance with the operative state and the inoperative state of the circuit. Further, wait time for changing an operative mode to an inoperative mode is required, which obstructs high rate operation.

SUMMARY OF THE INVENTION

It is an object of the present invention to provide a semiconductor device capable of suppressing the gate leak current of a transistor which is employed typically in a driver circuit and has a thin gate oxide film, and thereby decreasing power consumption.

A semiconductor device according to one aspect of the present invention includes a driver circuit for driving a voltage at an output node in accordance with an input signal received at an input node. The driver circuit includes first and second transistors and a control circuit. The first transistor is connected between a first voltage and the output node, and turned on and off in accordance with a voltage level of a first internal node. The second transistor is connected between the output node and a second voltage, and turned on and off complementarily to the first transistor in accordance with a voltage of a second internal node. The control circuit controls voltages of the first and second internal nodes so as to complementarily turn on the first and second transistors in accordance with the input signal. In addition, the control circuit has a voltage adjustment circuit connected to at least one of the first and second internal nodes. When one of the first and second transistors corresponding to the internal node connected to the voltage adjustment circuit is turned on in accordance with the voltage level of the connected internal node, the voltage adjustment circuit sets the voltage of the connected internal node at a voltage level different from the voltage levels of the first and second voltages.

As described above, the semiconductor device according to the present invention includes the first and second transistors turned on in accordance with voltage levels of the first and second internal nodes, and the control circuit for controlling voltages of the first and second internal nodes. In addition, the control circuit includes a voltage adjustment circuit setting the voltage of the internal node at a level different from the voltage levels of the first and second voltages. By providing this voltage adjustment circuit, it is possible to adjust the gate voltage of the connected transistor and decrease a gate leak current generated by the gate voltage applied to the connected transistor.

A semiconductor device according to another aspect of the present invention includes a driver circuit for driving a voltage at an output node in accordance with an input signal received at an input node. The driver circuit includes first, second and third transistors and a control circuit. The first transistor is connected between a first voltage and the output node, and turned on and off in accordance with a voltage level of a first internal node. The second transistor is connected between the output node and a second voltage, and turned on and off in accordance with a voltage level of a second internal node. The third transistor is connected in parallel to the second transistor between the output node and the second voltage, and turned on and off, complementarily to the first transistor, in accordance with the voltage level of the first internal node. The control circuit controls voltages of the first and second internal nodes so as to complementarily turn on the first transistor and the second and third transistors in accordance with the input signal. The control circuit sets one of the first and second voltages for turning on the second and third transistors to the first internal node so as to turn off the first transistor when the second and third transistors are turned on, and supplies the one of the first and second voltages to the second internal node for a predetermined period. In addition, the second transistor has a driving force for supplying the second voltage to the output node higher than that of the third transistor.

As described above, the semiconductor device according to the present invention includes the first and second transistors turned on in accordance with voltage levels of first and second internal nodes, the third transistor connected in parallel to the second transistor between the output node and the second voltage, and the control circuit for controlling voltages of the first and second internal nodes. The control circuit supplies one of the first and second voltages for turning off the first transistor when the second and third transistors are turned on, to the second internal node for a predetermined period. Further, the second transistor has a driving force for supplying the second voltage higher than that of the third transistor. With this configuration, the second voltage is supplied to the output node using the second transistor having a high driving force for the predetermined time. Accordingly, the driver circuit is operated at high rate using the second transistor having a high driving force and, also, the second transistor having high leak current is operated only for the predetermined time. It is therefore possible to decrease leak current.

A semiconductor device according to still another aspect of the present invention includes a first driver circuit and a second driver circuit arranged to be adjacent each other, each of the first and second driver circuits driving a voltage at an output node in accordance with an input signal received at an input node. Each of the first and second driver circuits includes first, second and third transistors and a control circuit. The first transistor is connected between a first voltage and the output node, and turned on and off in accordance with a voltage level of a first internal node. The second transistor is connected between the output node and a second voltage, and turned on and off in accordance with a voltage level of a second internal node. The third transistor is connected in parallel to the second transistor between the output node and the second voltage, and turned on and off, complementarily to the third transistor, in accordance with the voltage level of the first internal node. The control circuit controls voltages of the first and second internal nodes so as to complementarily turn on the first transistor and the second and third transistors in accordance with the input signal. The control circuit sets one of the first and second voltages for turning on the second and third transistors to the first internal node so as to turn off the first transistor when the second and third transistors are turned on, and supplies the one of the first and second voltages to the second internal node for a predetermined period. In addition, the second transistor has a driving force for supplying the second voltage to the output node higher than that of the third transistor. The control circuit of each of the first and second driver circuits includes a noise adjustment circuit. The noise adjustment circuit supplies one of the first and second voltages for turning on the second and third transistors to the second internal node in accordance with the input signal inputted to the adjacent driver circuit in a standby state.

As described above, the semiconductor device according to the present invention supplies one of the first and second voltages for turning on the second and third transistors in accordance with the input signal inputted to the adjacent driver circuit in a standby state, to the first internal node. Accordingly, in the standby state, the voltage for turning on the transistor is applied to the first internal node, whereby it is possible to eliminate noise even when the noise generates.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
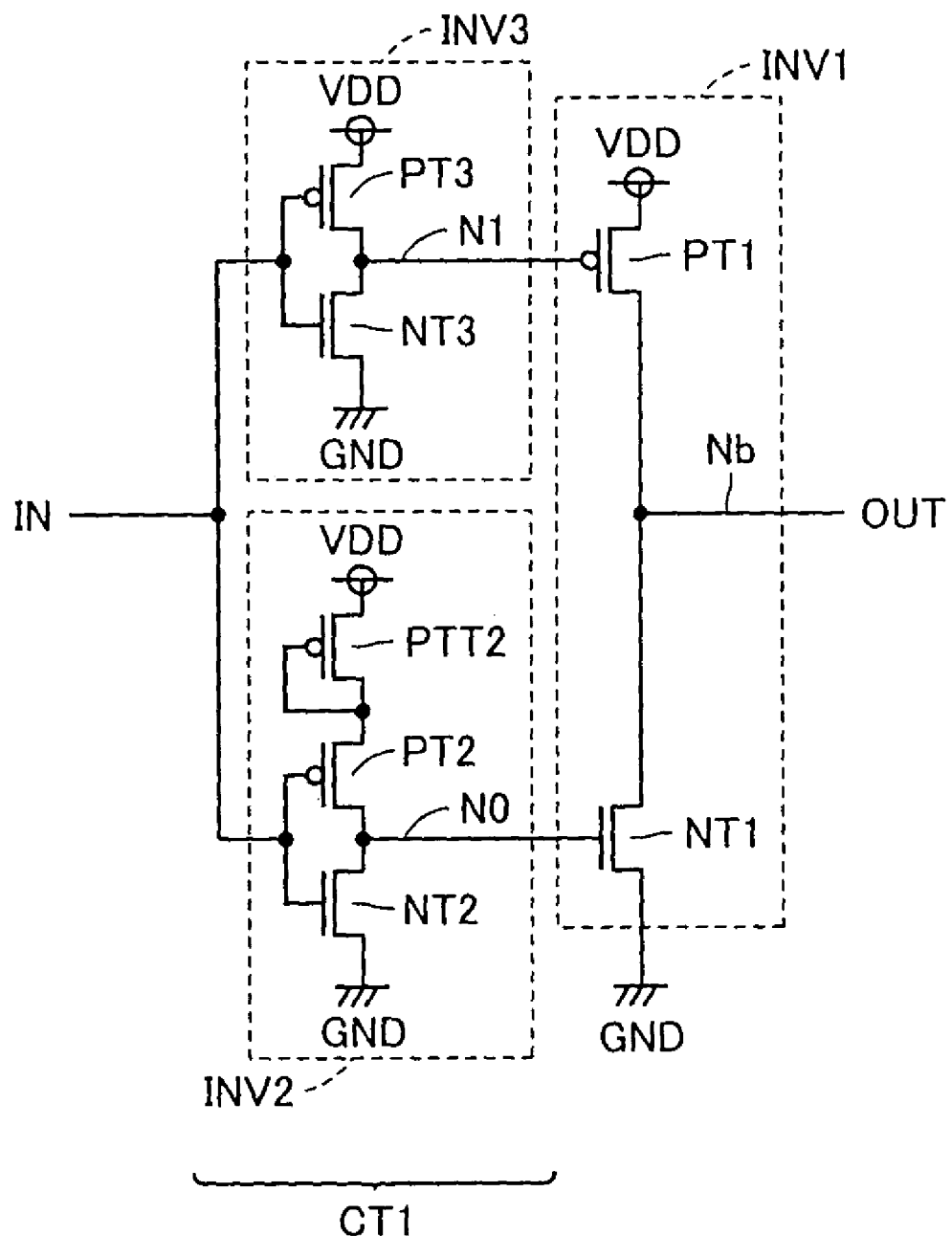
FIG. 1 is a circuit block diagram of a CMOS driver circuit according to a first embodiment of the present invention.

Embodiments of the present invention will be described hereinafter in detail with reference to the drawings. It is noted that same or corresponding sections are denoted by the same reference symbols, respectively in the drawings and will not be described repeatedly.

First Embodiment

Figure 18:
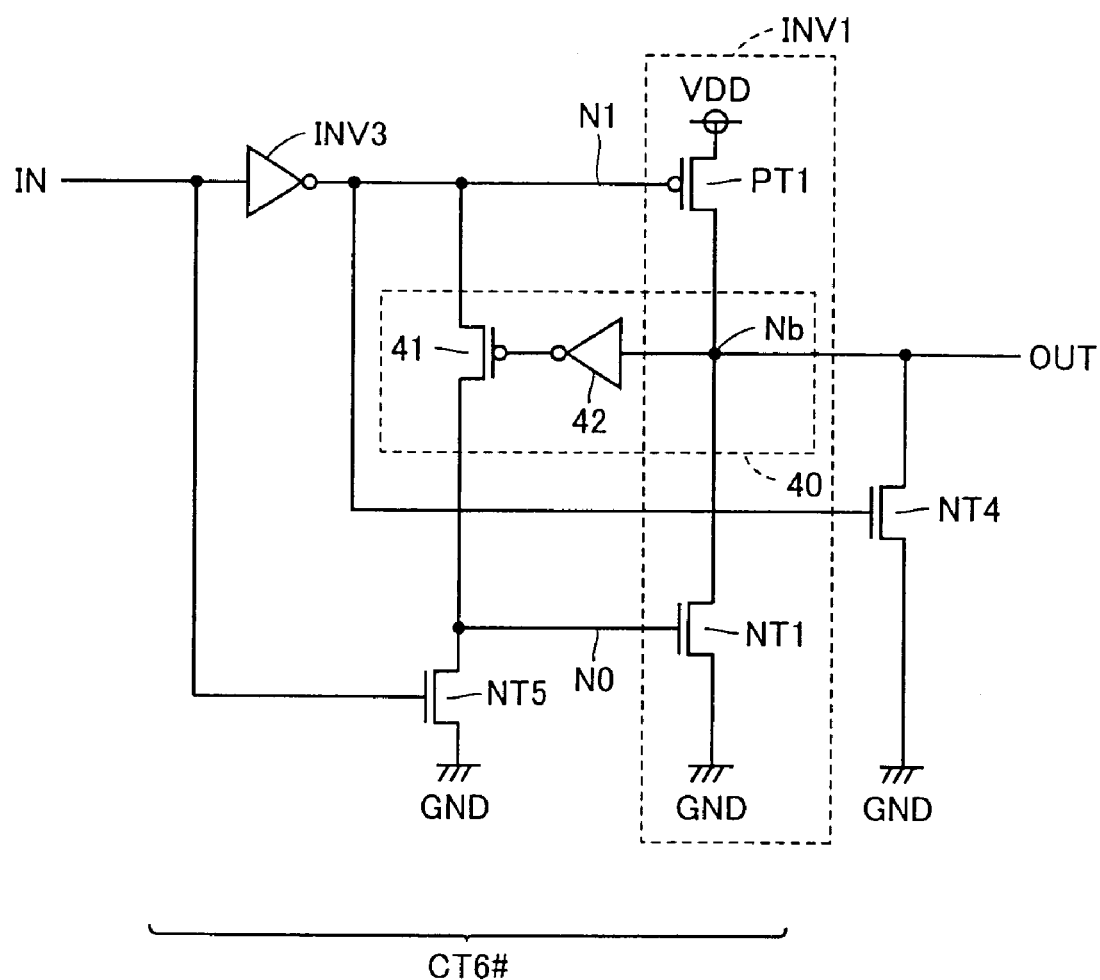
FIG. 18 is a circuit block diagram of a driver circuit according to a first modification of the sixth embodiment of the present invention.

Referring to FIG. 1, a driver circuit 100 according to a first embodiment of the present invention includes inverters INV1 to INV3. Driver circuit 100 differs from a conventional driver circuit in that inverter INV0 described with reference to FIG. 18 is eliminated and two inverter stages receiving input signal IN are provided. Specifically, inverter INV2 outputs its output result to a node N0 connected to the gate of transistor NT1 of inverter INV1 in response to input signal IN. Inverter INV3 outputs its output result to node N1 connected to the gate of transistor PT1 of inverter INV1 in response to input signal IN. Inverters INV2 and INV3 constitute a control circuit CT1 which controls the voltage levels of nodes N0 and N1.

Inverter INV2 includes transistors PTT2, PT2 and NT2. It is assumed herein that transistors PTT2 and PT2 are P-channel transistors. In addition, it is assumed herein that transistor NT2 is an N-channel transistor. In transistor PTT2, a source side is connected to power supply voltage VDD and a drain and a gate is electrically coupled to each other. Namely, transistor PTT2 is a so-called diode-connected transistor. Transistor PT2 is arranged between power supply voltage VDD and node N0 through transistor PTT2 and the gate thereof receives the input of input signal IN. Transistor NT2 is arranged between node N0 and ground voltage GND and the gate thereof receives the input of input signal IN.

Inverter INV3 includes transistors PT3 and NT3. It is assumed herein that transistor PT3 is a P-channel MOS transistor. In addition, it is assumed herein that transistor NT3 is an N-channel MOS transistor. Transistor PT3 is arranged between power supply voltage VDD and node N1 and the gate thereof receives the input of input signal IN. Transistor NT3 is arranged between node N1 and ground voltage GND and the gate thereof receives the input of input signal IN.

Figure 2:
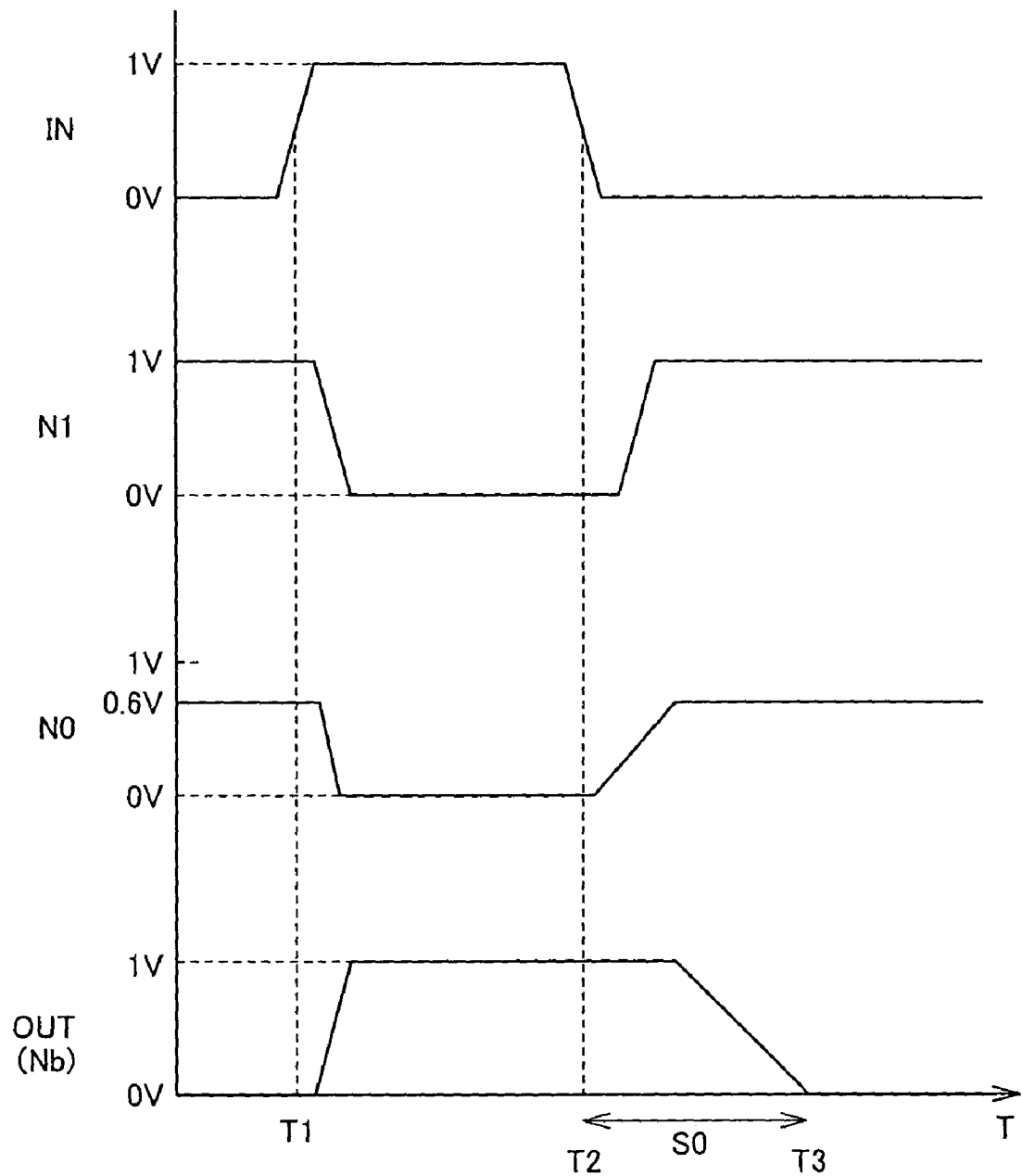
FIG. 2 is a timing chart showing the operation of the driver circuit according to the first embodiment.

Referring to the timing chart of FIG. 2, the operation of driver circuit 100 according to the first embodiment of the present invention will be described.

If input signal IN changes from 0 V to 1 V at time T1, transistor NT2 of inverter INV2 is turned on. In response to this, ground voltage GND is electrically coupled to node N0 and the voltage level of node N0 becomes made 0 V. In addition, transistor NT3 of inverter INV3 is turned on. In response to this, ground voltage GND is electrically coupled to node N1 and the voltage level of node N1 becomes made 0 V. In accordance with the voltage levels of nodes N0 and N1, inverter INV1 operates. Since nodes N0 and N1 are both 0 V, i.e., at "L" level, transistor PT1 is turned on and transistor NT1 is turned off. Accordingly, power supply voltage VDD is electrically coupled to an output node Nb and output node Nb thereby becomes 1 V.

Next, a case where input signal IN changes from 1 V to 0 V at time T2 will be considered. In inverter INV2, transistor NT2 is turned off and transistor PT2 is turned on. As a result, node N0 is electrically coupled to power supply voltage VDD through transistor PTT2. Further, in inverter INV3, transistor NT3 is turned off and transistor PT3 is turned on. As a result, node N1 is electrically coupled to power supply voltage VDD.

In accordance with the voltage levels of nodes N0 and N1, inverter INV1 drives the voltage for output node Nb. Since both nodes N0 and N1 are at "H" level, transistor NT1 is in an on-state and transistor PT1 is in an off-state. Accordingly, ground voltage GND is electrically coupled to node Nb and output node Nb thereby becomes 0 V.

Now, node N0 will be considered. The voltage level of node N0 is set at voltage level dropped from that of power supply voltage VDD by the threshold voltage of diode-connected transistor PTT2. It is assumed herein that the voltage level of node N0 dropped from that of power supply voltage VDD by the threshold voltage of transistor PTT2 is higher than the on-state voltage of transistor NT1 (e.g., 0.5 V). If the threshold voltage of transistor PTT2 is, for example, 0.4 V, the voltage level of node N0 is set at 0.6 V (1 V–0.4 V). Therefore, a gate voltage at which the transistor is turned on is set at voltage level (0.6 V) lower than the level of power supply voltage VDD (1 V). As a result, transistor NT1 is turned on. Therefore, node Nb is electrically coupled to ground voltage GND and completely falls to 0 V at time T3.

Figure 3:
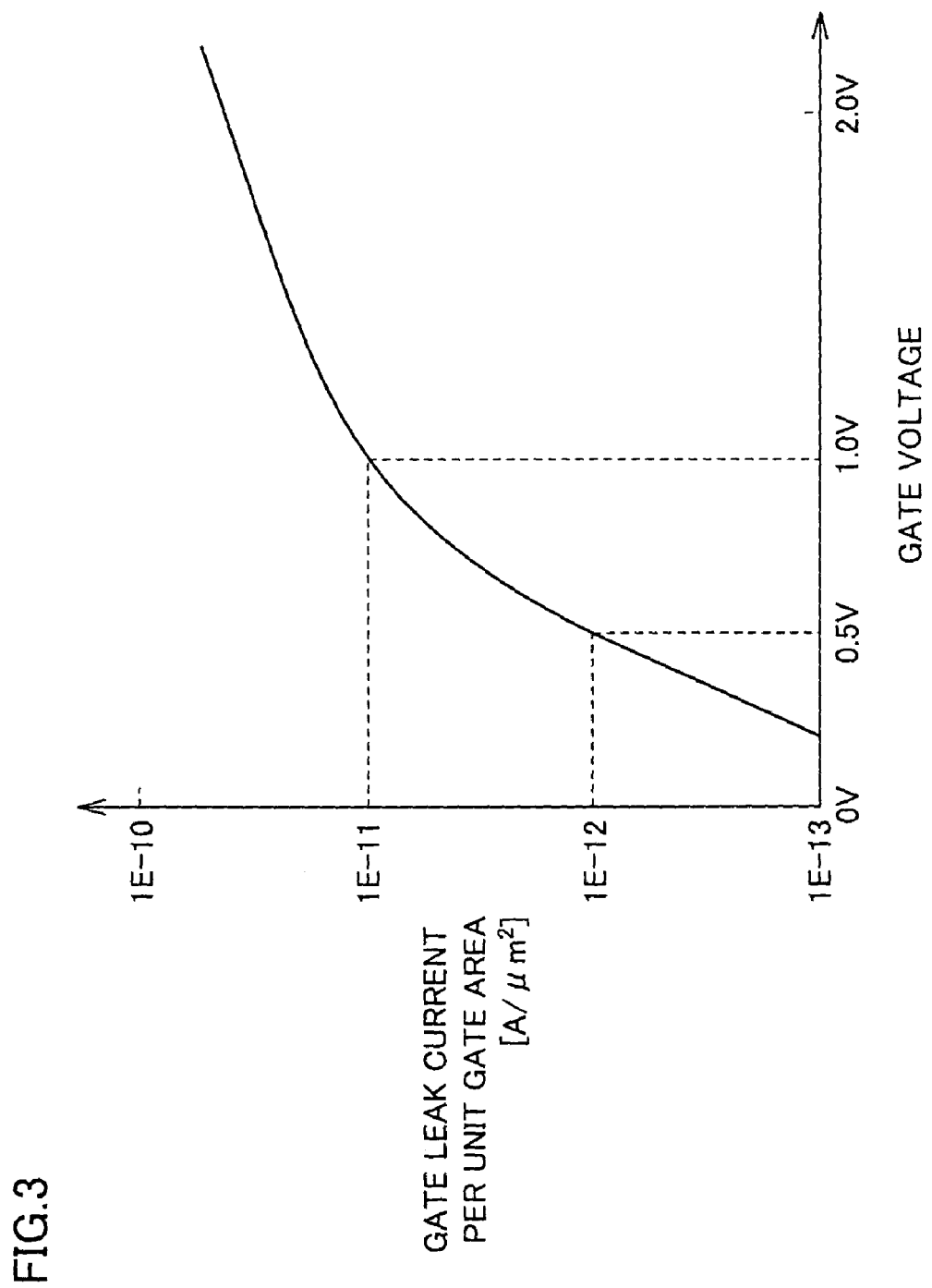
FIG. 3 shows the relationship between a gate leak current per unit gate area of a transistor and a gate voltage.

In FIG. 3, the horizontal axis indicates gate voltage (V) and the vertical axis indicates gate leak current (A/μm$^2$) which flows per unit gate area of the transistor.

As shown in FIG. 3, if the voltage level of the gate voltage is 1 V, the gate leak current per unit gate area at this time is set at 1E–11 (A/μm$^2$). If the gate voltage is dropped to 0.5 V, the gate leak current is decreased by one figure and set at 1E–12 (A/μm$^2$). As can be seen, since the gate leak current shows the characteristic of the transistor which logarithmically changes relative to the gate voltage, the leak current of the transistor is greatly decreased only by slightly dropping the gate voltage.

Driver circuit 100 according to the first embodiment of the present invention controls the voltages of nodes N0 and N1 in accordance with input signal IN using inverters INV2 and INV3. In addition, using transistor NTT2 included in inverter INV2, driver circuit 100 adjusts the voltage level of transistor NT1 and decreases leak current.

That is, by setting the gate voltage supplied to the gate of transistor NT1 to be lower than power supply voltage VDD and higher than on-state voltage as described above, it is possible to greatly decrease the gate leak current of transistor NT1.

The configuration of driver circuit 100 according to the first embodiment of the present invention enables realizing a CMOS driver circuit which requires low power consumption and operates at high rate, without the need to provide a circuit or the like which controls power supply in accordance with the operative and inoperative states of the circuit and to change an operative mode to and from an inoperative mode.

Second Embodiment

Figure 4:
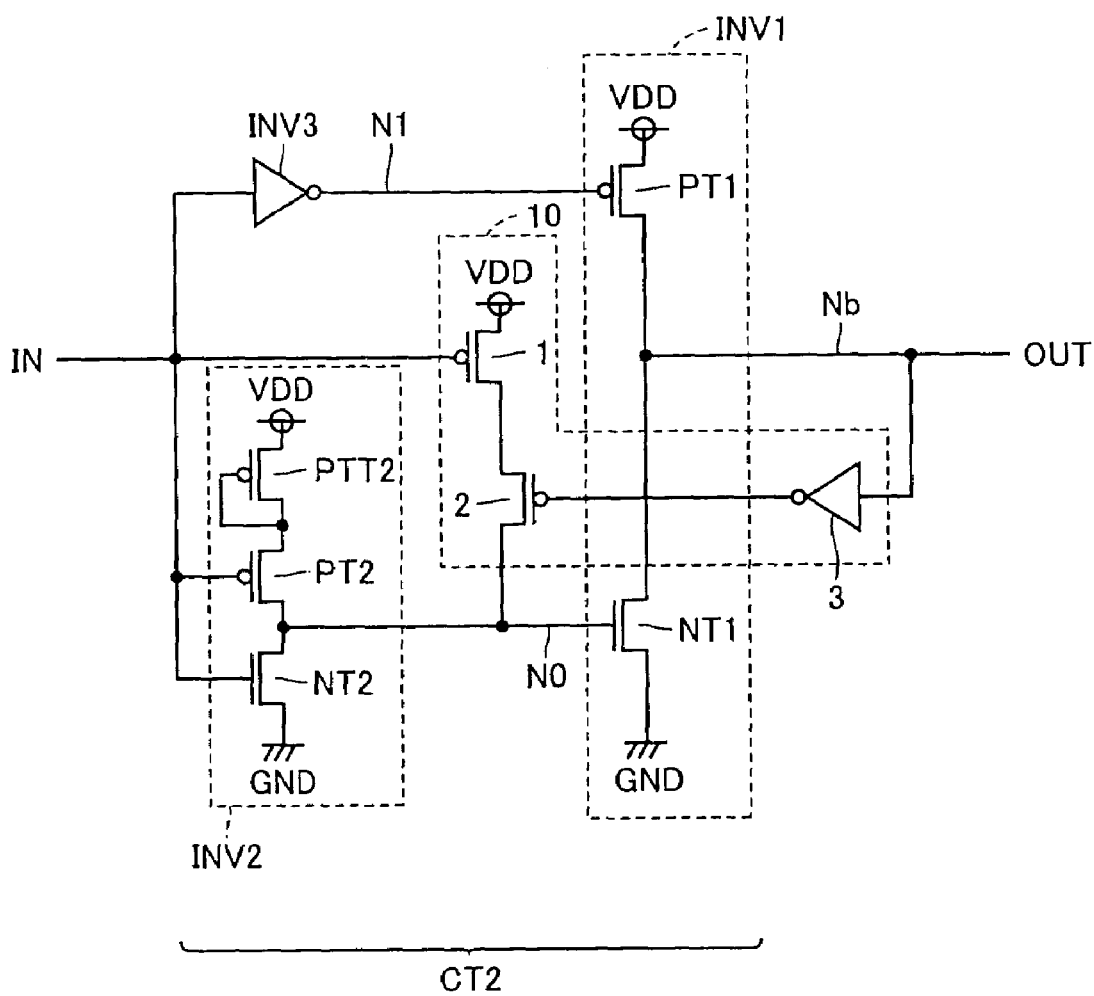
FIG. 4 is a block diagram of a driver circuit according to a second embodiment of the present invention.

Referring to FIG. 4, a driver circuit 200 according to a second embodiment of the present invention differs from driver circuit 100 shown in FIG. 1 in that a timing circuit 10 which adjusts the voltage level of an internal node for a predetermined period is further provided. Since the other constituent elements of driver circuit 200 are the same as those of driver circuit 100 in the first embodiment, they will not be described herein repeatedly. In addition, inverters INV2 and INV3 and timing circuit 10 constitute a control circuit CT2 which controls the voltage levels of nodes N0 and N1.

Timing circuit 10 includes transistors 1 and 2 and an inverter 3. It is assumed herein that transistors 1 and 2 are P-channel MOS transistors. Transistors 1 and 2 are connected in series between power supply voltage VDD and node N0 and the gate of transistor 1 receives the input of input signal IN. The gate of transistor 2 receives the input of the inverted signal of output signal OUT through inverter 3.

Referring to the timing chart of FIG. 5, the operation of driver circuit 200 according to the second embodiment of the present invention will be described.

If input signal IN changes from 0 V to 1 V at time T1, timing circuit 10 does not substantially function. Therefore, driver circuit 200 operates in the same manner as driver circuit 100 described in the first embodiment with reference to FIG. 2, which will not be described herein repeatedly.

A case where input signal IN changes from 1 V to 0 V at time T2 will be considered. If input signal IN changes from 1 V to 0 V, transistor PT2 is turned on and power supply voltage VDD is electrically coupled to node N0 through transistor PTT2 in inverter INV2. Therefore, inverter INV2 is to set the voltage level of node N0 at 0.6 V as described above.

Now, the operation of timing circuit 100 will be considered. Inverter 3 outputs the inverted signal ("L" level) of output signal OUT ("H" level) to transistor 2, and transistor 2 is in an on-state. If input signal IN changes from 1 V to 0 V at time T2, transistor 1 is turned on. Since transistors 1 and 2 are turned on, power supply voltage VDD is electrically coupled to node N0. Accordingly, the voltage level of node N0 is set at 1 V. In response to this, transistor NT1 of inverter INV1 is turned on, ground voltage GND is electrically coupled to node Nb and the voltage level of node Nb is thereby set at 0 V ("L" level). If the voltage level of node Nb changes to 0 V, timing circuit 10 turns off transistor 2. That is, the supply of power supply voltage VDD (1 V) from timing circuit 10 to node N0 is stopped.

In driver circuit 200 according to the second embodiment of the present invention, when transistor NT1 is turned on, timing circuit 10 temporarily, electrically couples node N0 directly to power supply voltage VDD, whereby driver circuit 200 increases the on-state current of transistor NT1 and accelerates operation rate.

Thereby, it is possible to shorten time for setting the voltage level of node Nb at 0 V. In other words, the driver circuit according to the first embodiment requires a period S0 from time T2 at which input signal IN becomes 0 V to time T3 at which output signal OUT becomes 0 V since the gate voltage of transistor NT1 is set at 0.6 V as shown in FIG. 2. With the configuration of driver circuit 200 according to the second embodiment of the present invention, by contrast, the voltage level of the gate voltage is set at 1 V when transistor NT1 operates, whereby a period S1 from time T2 at which input signal IN becomes 0 V to time T4 at which output signal OUT becomes 0 V can be made shorter than period S0.

Moreover, after time T4 at which output signal OUT becomes 0 V, power supply voltage VDD is electrically disconnected from node N0, so that the voltage level of node N0 drops to 0.6 V within the range of the on-state voltage of transistor NT1. Therefore, in a stationary state in which output signal OUT is 0 V, it is possible to decrease the gate leak current by dropping the gate voltage applied to transistor NT1.

First Modification of Second Embodiment

Figure 5:
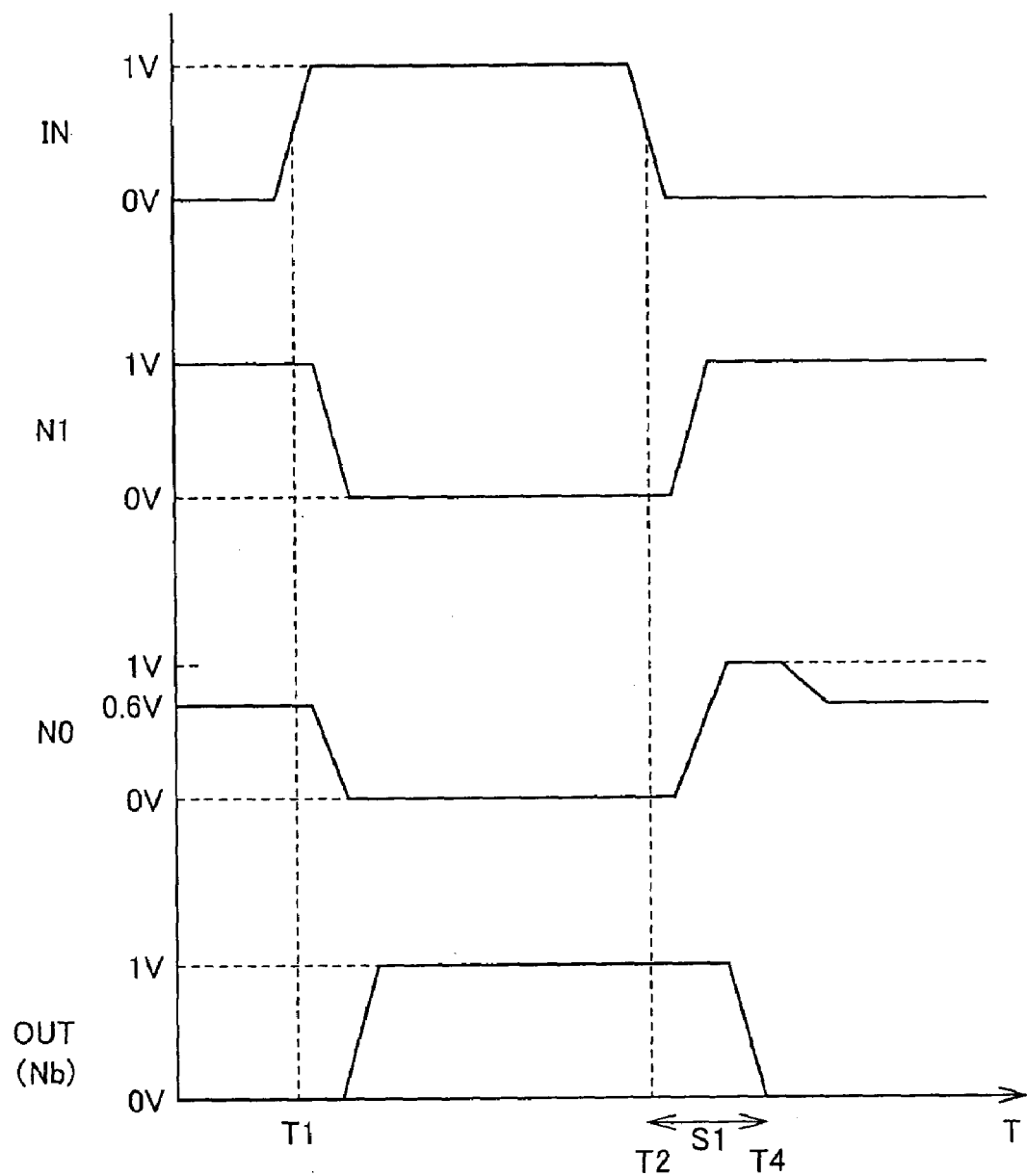
FIG. 5 is a timing chart showing the operation of the driver circuit according to the second embodiment.
Figure 6:
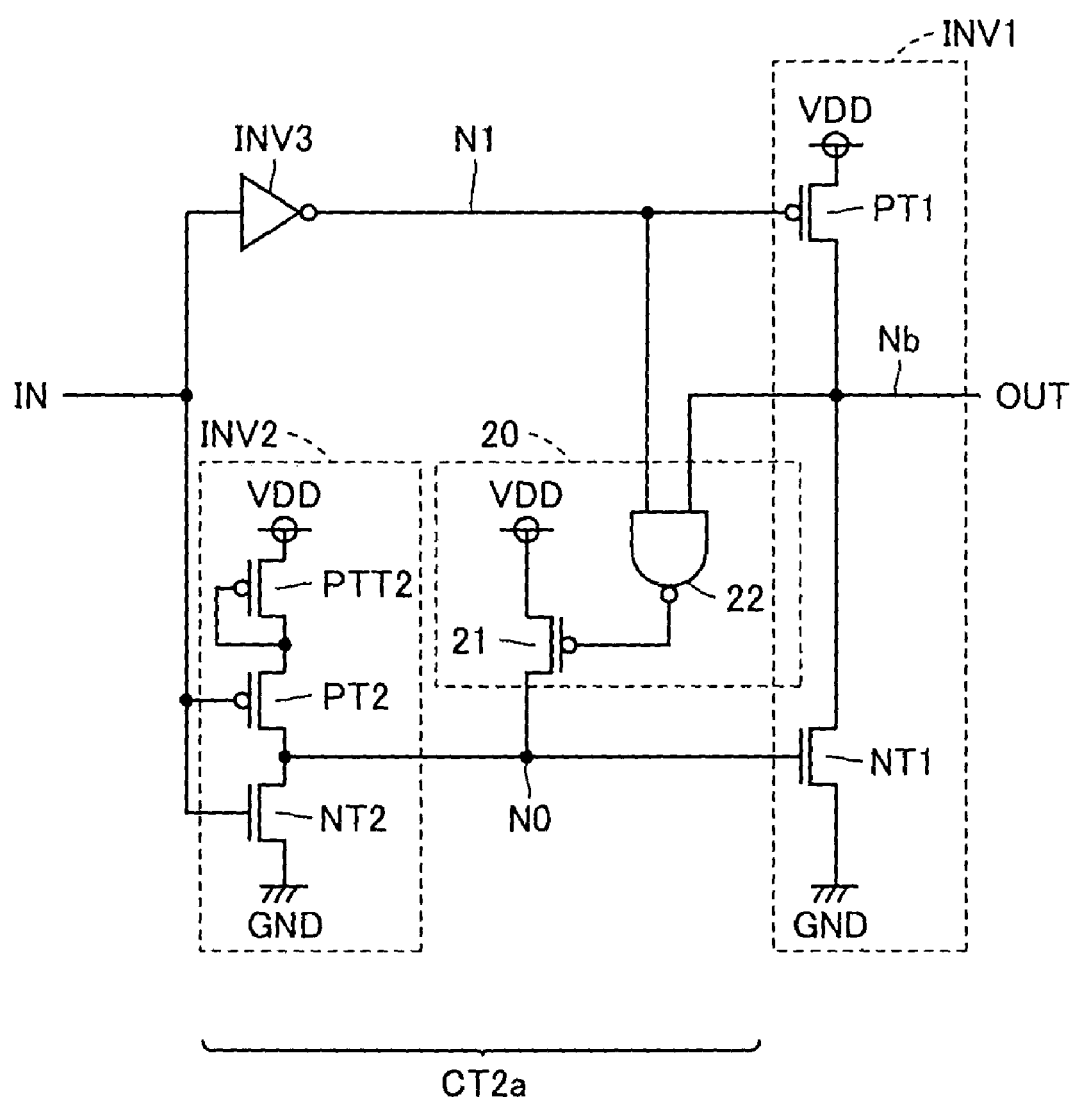
FIG. 6 is a circuit block diagram of a CMOS driver circuit according to a first modification of the second embodiment of the present invention.

Referring to FIG. 6, a driver circuit 210 according to a first modification of the second embodiment of the present invention differs from driver circuit 200 shown in FIG. 5 according to the second embodiment of the present invention in that timing circuit 10 is replaced by a timing circuit 20. In addition, inverters INV2 and INV3 and timing circuit 20 constitutes a control circuit CT2# which controls the voltage levels of nodes N0 and N1.

Timing circuit 20 includes a transistor 21 and a NAND circuit 22. It is assumed herein that transistor 21 is a P-channel MOS transistor. NAND circuit 22 receives output signal OUT from node Nb and a signal transmitted from node N1, and outputs a NAND logic operation result for these signals to the gate of transistor 21. Transistor 21 is arranged between power supply voltage VDD and node N0, and the gate thereof receives the input of NAND circuit 22.

The operation of driver circuit 210 according to the first modification of the second embodiment of the present invention is the same as that of driver circuit according to the second embodiment shown in the time chart of FIG. 5. Specifically, if input signal IN changes from 1 V to 0 V at time T2, the voltage level of node N1 becomes 1 V ("H" level). At this moment, the voltage level of node Nb is 1 V ("H" level), so that the level of the output signal of NAND circuit 22 becomes "L" level and transistor 21 is turned on. Therefore, power supply voltage VDD is electrically coupled to node N0 and the voltage level of node N0 becomes 1 V as in the case of the configuration of the driver circuit according to the second embodiment. In response to this, transistor NT1 is turned on, ground voltage GND is electrically coupled to node Nb and the voltage level of node Nb thereby becomes 0 V. In response to this, the level of the output signal of NAND circuit 22 becomes "H" level and transistor 21 is turned off. Since the following operation is the same as that of the driver circuit according to the second embodiment of the present invention, it will not be described herein repeatedly. Namely, with the configuration of driver circuit 210 according to the first modification of the second embodiment of the present invention, if transistor NT1 is to be turned on, timing circuit 20 electrically, directly couples node N0 to power supply voltage VDD, thereby operating transistor NT1 at high rate. In addition, timing circuit 20 can decrease the gate leak current by dropping the gate voltage (to 0.6 V) in a stationary state in which output signal OUT is 0 V.

The configuration of driver circuit 210 according to the first modification of the second embodiment of the present invention enables decreasing power consumption as in the case of the configuration of the driver circuit according to the second embodiment.

Second Modification of Second Embodiment

Figure 7:
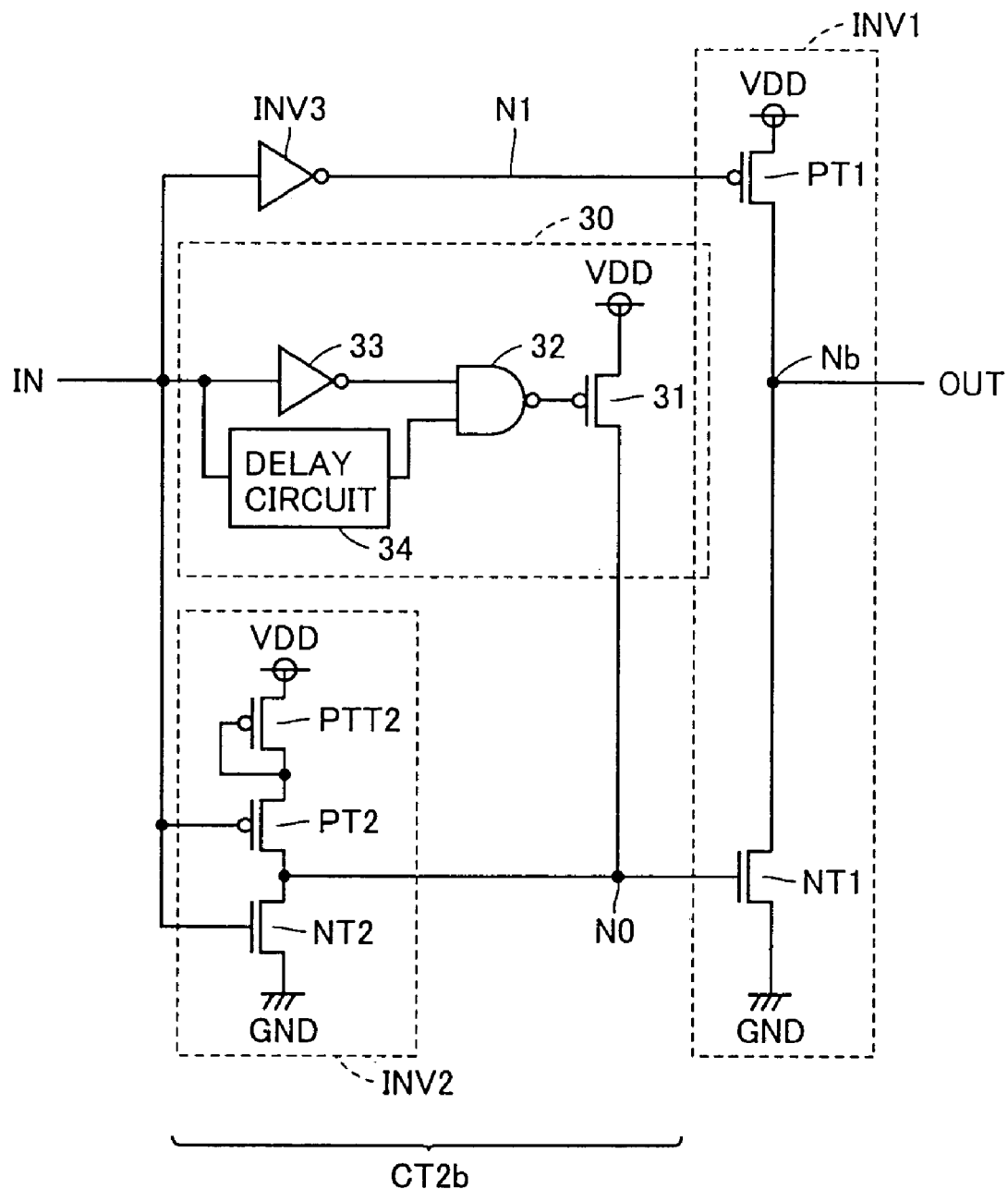
FIG. 7 is a circuit block diagram of a CMOS driver circuit according to a second modification of the second embodiment of the present invention.

Referring to FIG. 7, a driver circuit 220 according to a second modification of the second embodiment of the present invention differs from driver circuit 210 shown in FIG. 6 in that timing circuit 20 is replaced by a timing circuit 30. In addition, inverters INV2 and INV3 and timing circuit 30 constitutes a control circuit CT2a which controls the voltage levels of nodes N0 and N1.

Timing circuit 30 includes a transistor 31, a NAND circuit 32, an inverter 33 and a delay circuit 34. It is assumed herein that transistor 31 is a P-channel MOS transistor as one example. NAND circuit 32 receives the inverted signal of input signal IN through inverter 33 and the delay signal of input signal IN by a predetermined delay which is delayed by delay circuit 34, and outputs a NAND logic operation result for these signals to the gate of transistor 31. Transistor 31 is arranged between power supply voltage VDD and node N0, and the gate thereof receives the output signal of NAND circuit 32.

The operation of driver circuit 220 according to the second modification of the second embodiment of the present invention is the same as that of driver circuit according to the second embodiment shown in FIG. 5.

Timing circuit 30 turns on transistor 31 for delay time given by delay circuit 34 and electrically couples power supply voltage VDD to node N0. That is, the voltage level of node N0 is set at 1 V.

As a result, by adjusting the delay time given by delay circuit 34, it is possible to adjust time for which node N0 is electrically coupled to power supply voltage VDD. In other words, it is possible to adjust the period in which voltage level of node N0 is 1 V. It is thereby possible to more efficiently supply power supply voltage VDD to node N0 and to further decrease power consumption.

Third Embodiment

Figure 8:
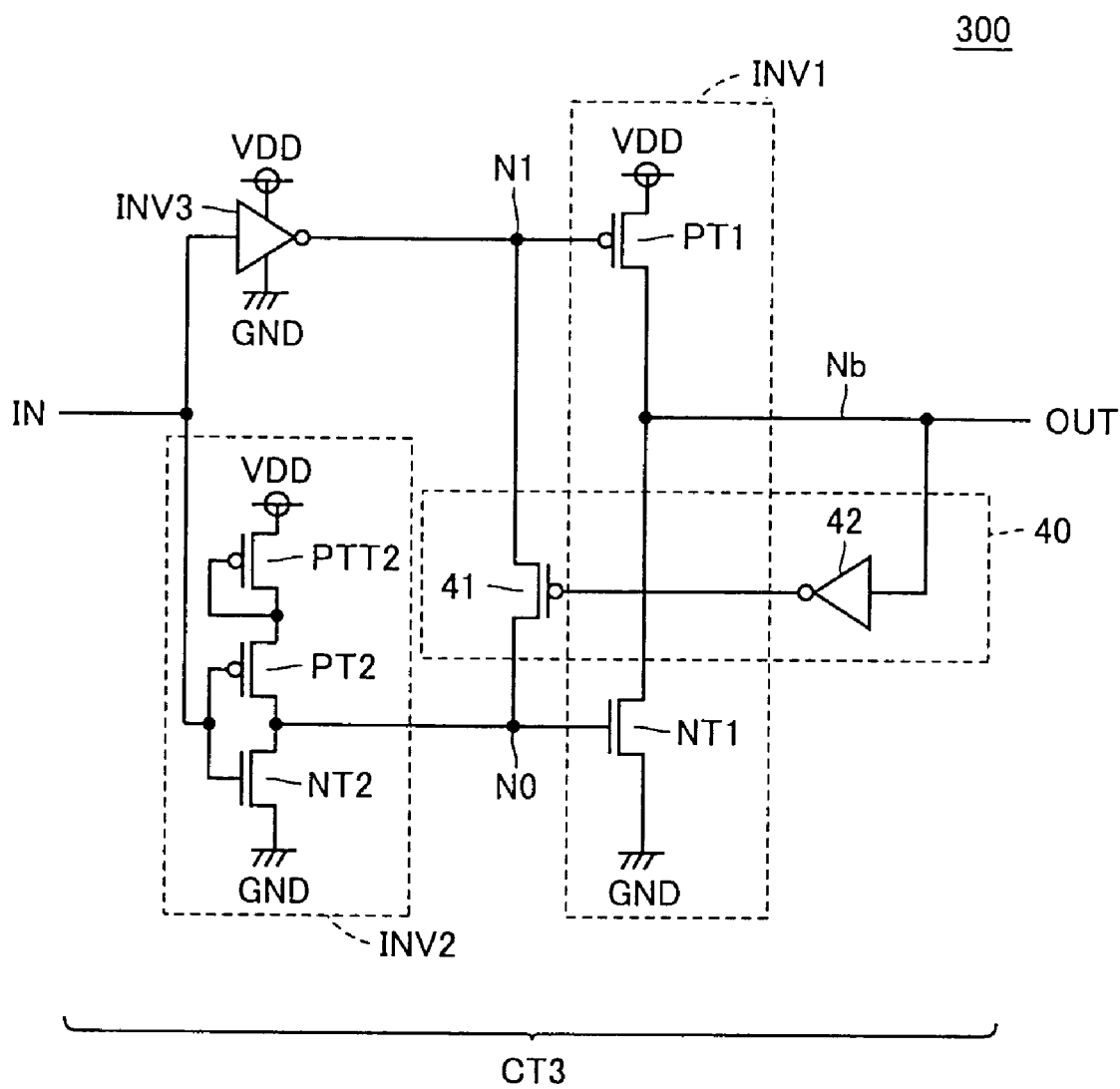
FIG. 8 is a circuit block diagram of a CMOS driver circuit according to a third embodiment of the present invention.

Referring to FIG. 8, a driver circuit 300 according to a third embodiment of the present invention differs from the driver circuit according to the second embodiment described with reference to FIG. 4 in that timing circuit 10 is replaced by a timing circuit 40. Timing circuit 40 includes a transistor 41 and an inverter 42. It is assumed herein that transistor 41 is a P-channel MOS transistor as one example. Transistor 41 is arranged between nodes N1 and N0 and the gate thereof receives the input of the inverted signal of output signal OUT through inverter 42. In addition, inverters INV2 and INV3 and timing circuit 40 constitute a control circuit CT3 which controls the voltage levels of nodes N0 and N1.

Timing circuit 40, similarly to timing circuit 20, temporarily, electrically couples power supply voltage VDD to node N0 when transistor NT1 is turned on. Specifically, if output signal OUT is 1 V ("H" level), transistor 41 is turned on and nodes N1 and N0 are electrically coupled to each other.

The operation of driver circuit 300 according to the second embodiment of the present invention is the same as that of driver circuit 200 according to the second embodiment described with reference to FIG. 5. Specifically, a case where input signal IN changes from 1 V to 0 V will be considered. Since output signal OUT is 0 V at this time, transistor 41 sets nodes N1 and N0 in a state in which they are electrically conductive to each other in timing circuit 40. In response to the change of input signal IN from 1 V to 0 V, inverter INV3 electrically couples node N1 to power supply voltage VDD (1 V). Accordingly, node N0 is electrically coupled to power supply voltage VDD. In response to this, transistor NT1 of inverter INV1 is turned on and node Nb is electrically coupled to ground node GND (0 V). In addition, timing circuit 40 disconnects node N1 from node N0. That is, with the configuration of driver circuit 300 according to the third embodiment of the present invention, if transistor NT1 is to be turned on, timing circuit 40 electrically, directly couples power supply voltage VDD to node N0, whereby it is possible to operate transistor NT1 at high rate. Further, in a stationary state in which output signal OUT is 0 V, transistor 41 is turned off and the gate voltage of transistor NT1 is dropped (to 0.6 V) by using timing circuit 40, whereby it is possible to decrease gate leak current.

First Modification of Third Embodiment

Figure 9:
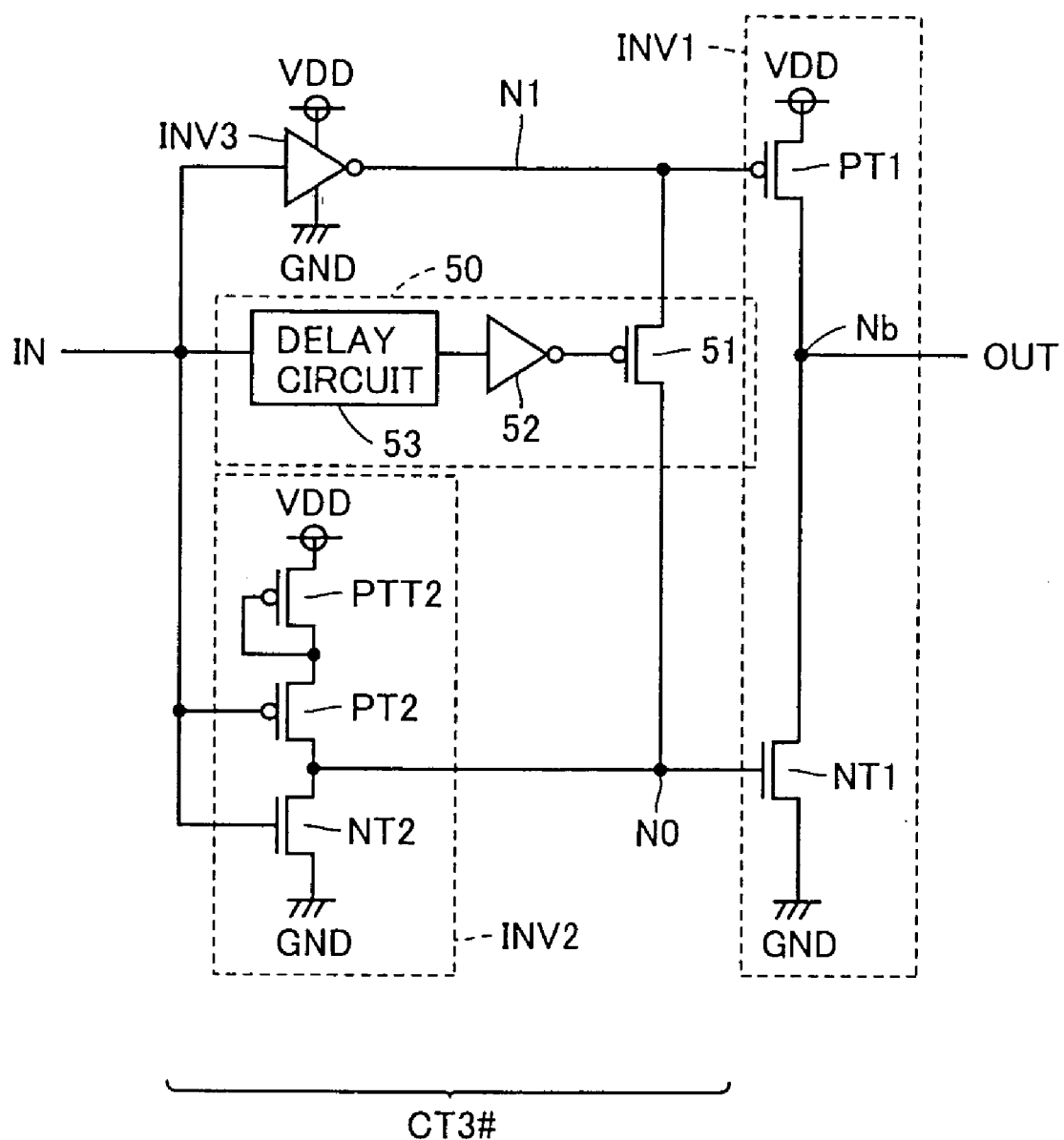
FIG. 9 is a circuit block diagram of a CMOS driver circuit according to a first modification of the third embodiment of the present invention.

Referring to FIG. 9, a driver circuit 310 according to a first modification of the third embodiment of the present invention differs from the driver circuit according to the third embodiment shown in FIG. 8 in that timing circuit 40 is replaced by a timing circuit 50. In addition, inverters INV2 and INV3 and timing circuit 50 constitutes a control circuit CT3# which controls the voltage levels of nodes N0 and N1.

Timing circuit 50 includes a transistor 51, an inverter 52 and a delay circuit 53. It is assumed herein that transistor 51 is a P-channel MOS transistor as one example. Transistor 51 is arranged between nodes N1 and N0 and receives the input of the inverted signal of input signal IN which passes through delay circuit 53 through inverter 52. That is, timing circuit 50 delays input signal IN by the passage delay time of input signal IN for passing through inverter 52 and delay circuit 53. Therefore, in response to the change of input signal IN from 1 V to 0 V, transistor 51 changes a state where nodes N0 and N1 are conductive to each other to a nonconductive state after the elapse of prescribed delay time.

The operation of driver circuit 310 according to the first modification of the third embodiment of the present invention is the same as that described with reference to FIG. 5.

If input signal IN changes from 1 V to 0 V, timing circuit 50 sets transistor 51 which is in an on-state after the passage of the delay time of input signal IN by delay circuit 53, to be turned off. In response to the change of input signal IN from 1 V to 0 V, inverter INV3 electrically couples power supply voltage VDD to node N1. Therefore, for a period which corresponds to the delay time given by delay circuit 53, power supply voltage VDD is electrically coupled to node N0 and the voltage level of node N0 is set at 1 V.

As a result, by adjusting the delay time given by delay circuit 53, it is possible to adjust electrical connection time for which node N0 is electrically connected to power supply voltage VDD. In other words, it is possible to adjust the period for which the voltage level of node N0 is set at 1 V. It is thereby possible to efficiently supply power supply voltage VDD to node N0 and to further decrease power consumption.

Fourth Embodiment

In each of the first to third embodiments, the configuration of the driver circuit in which the gate voltage is adjusted when N-channel MOS transistor NT1 is turned on, whereby overall power consumption is decreased, has been described. A driver circuit according to a fourth embodiment of the present invention is intended to decrease not only the gate leak current of N-channel MOS transistor NT1 but also that of P-channel MOS transistor PT1 and to thereby further decrease overall power consumption.

Figure 10:
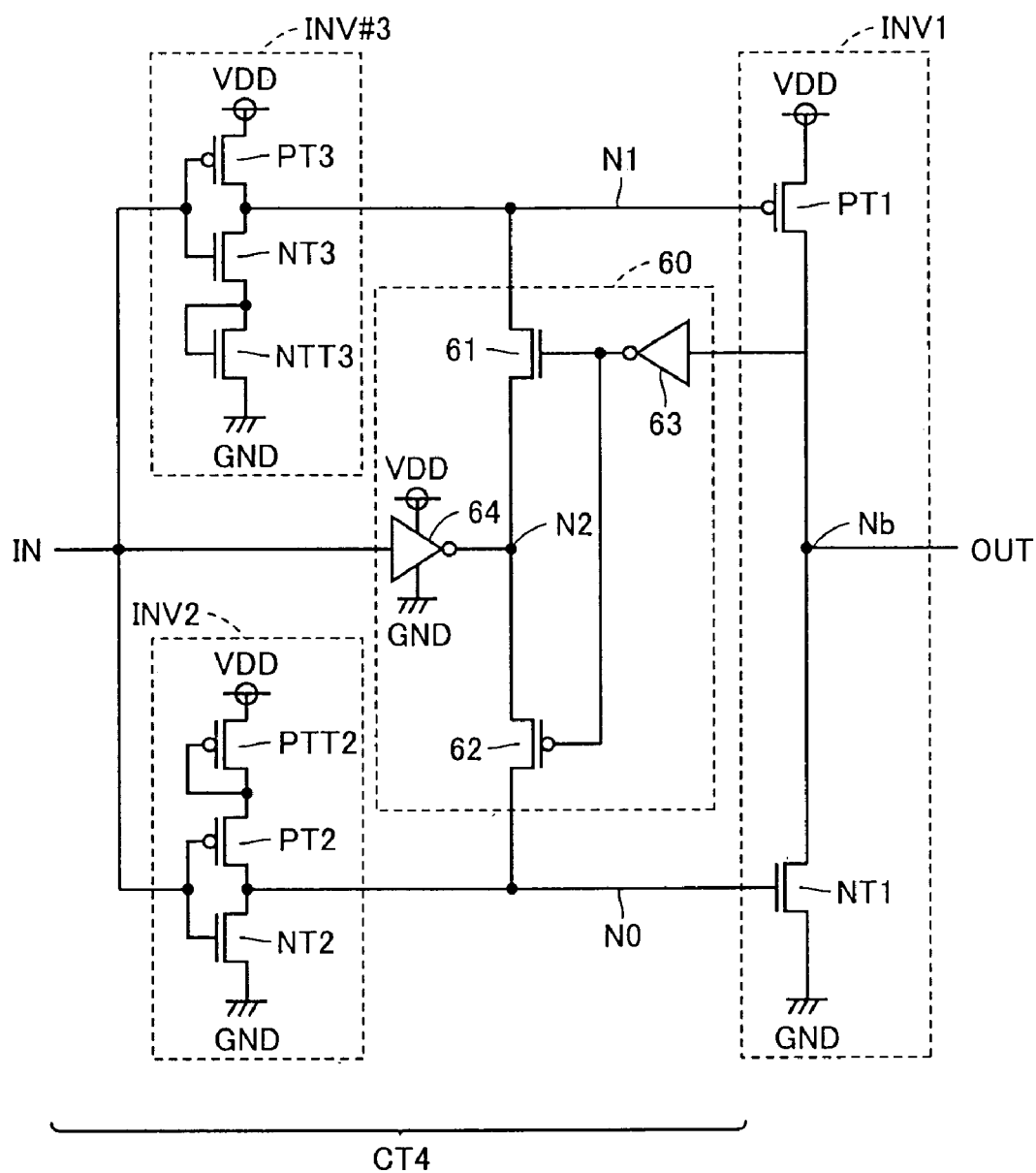
FIG. 10 a circuit block diagram of a CMOS driver circuit according to a fourth embodiment of the present invention.

Referring to FIG. 10, a driver circuit 400 according to the fourth embodiment of the present invention differs from driver circuit 300 according to the third embodiment in that inverter INV3 is replaced by an inverter INV#3 and timing circuit 40 is replaced by a timing circuit 60. Since the other constituent elements of driver circuit 400 are the same as those of driver circuit 300, they will not be repeatedly described herein. In addition, inverters INV2 and INV#3 and timing circuit 60 constitutes a control circuit CT4 which controls the voltage levels of nodes N0 and N1.

Inverter INV#3 differs from inverter INV3 in that a transistor NTT3 is further provided. It is assumed herein that transistor NTT3 is an N-channel MOS transistor as one example. Transistor NTT3 is a so-called diode-connected transistor in which a source side is connected to ground node GND and a drain and a gate are electrically coupled to each other. Further, transistor NTT3 is arranged between transistor NT3 and ground voltage GND. Inverter INV#3 electrically couples ground voltage GND to node N1 through transistor NTT3 if transistor NT3 is turned on. At this time, the voltage level of node N1 is higher than ground voltage GND level by the threshold voltage of transistor NTT3. It is assumed that the voltage level rising from ground voltage GND level by the threshold voltage of transistor NTT3 is within the on-state voltage (e.g. 0.7 V) of transistor PT1. It is assumed herein that the threshold voltage of transistor NTT3 is 0.4 V as one example. Therefore, transistor PT1 is turned on at a voltage of 0.4 V.

Timing circuit 60 includes transistors 61 and 62 and inverters 63 and 64. It is assumed herein that transistor 61 is an N-channel MOS transistor as one example. It is also assumed herein that transistor 62 is a P-channel MOS transistor. Inverter 64 receives the input of input signal IN and transmits the inverted signal of input signal IN to a node N2. Transistor 61 is arranged between nodes N1 and N2 and the gate thereof receives the input of the inverted signal of output signal OUT through inverter 63. Transistor 62 is arranged between nodes N2 and N0 and the gate thereof receives the input of the inverted signal of output signal OUT through inverter 63. Namely, transistors 61 and 62 are turned on complementarily to each other and node N2 is electrically coupled to either node N1 or N0.

Figure 11:
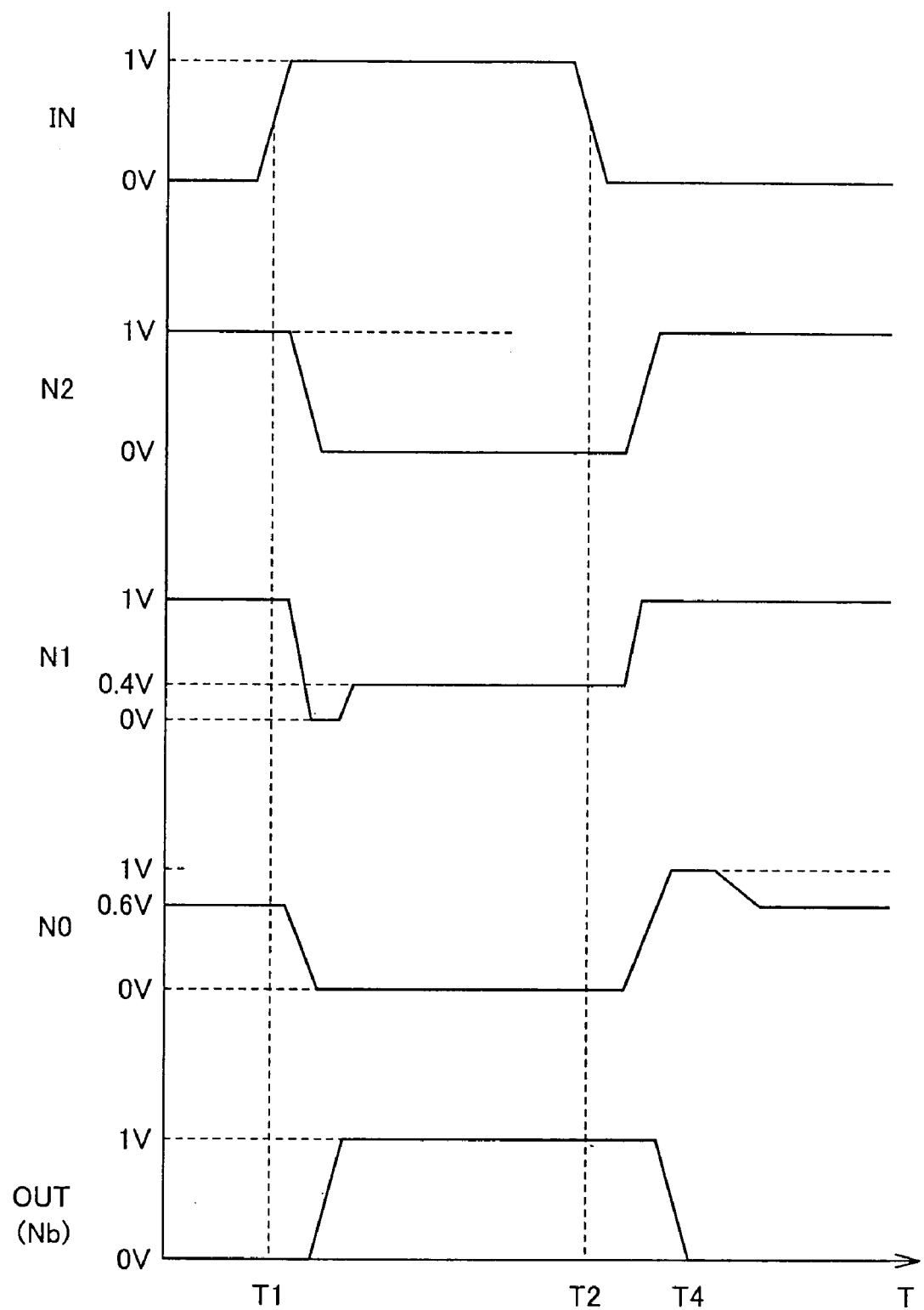
FIG. 11 is a timing chart showing the operation of the driver circuit according to the fourth embodiment.

Referring to the timing chart of FIG. 11, the operation of driver circuit 400 according to the fourth embodiment of the present invention will be described.

If input signal IN changes from 0 V to 1 V at time T1, transistor NT2 of inverter INV2 is turned on and the voltage level of node N0 becomes 0 V. In inverter INV#3, transistor NT3 is turned on. Therefore, inverter INV#3 is to set the voltage level of node N1 at 0.4 V.

At this moment, timing circuit 60 sets transistor 61 in a conductive state by output signal OUT ("L" level) through inverter 63. In this case, if input signal IN changes from 0 V to 1 V, inverter 64 electrically couples node N2 to ground voltage GND. That is, since nodes N0 and N1 are conductive to each other, the voltage level of node N1 eventually falls to 0 V. Accordingly, transistor PT1 of inverter INV1 is turned on, power supply voltage VDD is electrically coupled to node Nb and the voltage level of node Nb is set at 1 V.

Further, in response to this, timing circuit 60 turns off transistor 61 to set transistor 61 in a nonconductive state and turns on transistor 62 to set transistor 62 in a conductive state. Therefore, if transistor PT1 is turned on, timing circuit 60 electrically, directly couples ground voltage GND to node Nb, thereby increasing the on-state current of transistor PT1 and accelerating operation rate. It is thereby possible to shorten time required for the voltage level of node Nb to change to 1 V.

Furthermore, after the time at which output signal OUT becomes 1 V, ground voltage GND is electrically disconnected from node N1, the voltage level of node N1 rises to 0.4 V within the on-state voltage of transistor PT1. Therefore, in a stationary state in which output signal OUT is 1 V, it is possible to decrease the gate leak current of P-channel MOS transistor PT1 by raising the gate voltage.

Next, if input signal IN changes from 1 V to 0 V at time T2, driver circuit 400 operates in the same manner as that of driver circuit 200 described with reference to FIG. 5. Therefore, it will not be described herein repeatedly.

Specifically, while N-channel MOS transistor NT1 operates, inverter 64 electrically, directly couples power supply voltage VDD to node N0. In addition, in a stationary state in which output signal OUT is 0 V, it is possible to decrease the leak current of N-channel MOS transistor NT1 by decreasing the gate voltage.

With the configuration of driver circuit 400 according to the fourth embodiment of the present invention, while transistors NT1 and PT1 operate, ordinary power supply voltage VDD and ground voltage GND are supplied thereto, respectively, whereby it is possible to operate the transistors at high rate. In a stationary state, it is possible to decrease the leak current by dropping and raising the voltages of transistors NT1 and PT1, respectively.

In other word, driver circuit 400 according to the fourth embodiment of the present invention enables decreasing the leak current of transistor NT1 and that of PT1 and thereby further decreasing overall power consumption.

Fifth Embodiment

In each of the first to fourth embodiments, the configuration of the driver circuit which outputs output signal OUT in response to one input, i.e., input signal IN has been described.

In a fifth embodiment of the present invention, the circuit configuration of a driver circuit 500 in which output signal OUT which is an AND logical operation result is outputted in response to two inputs, i.e., input signals IN1 and IN2 will be described.

Figure 12:
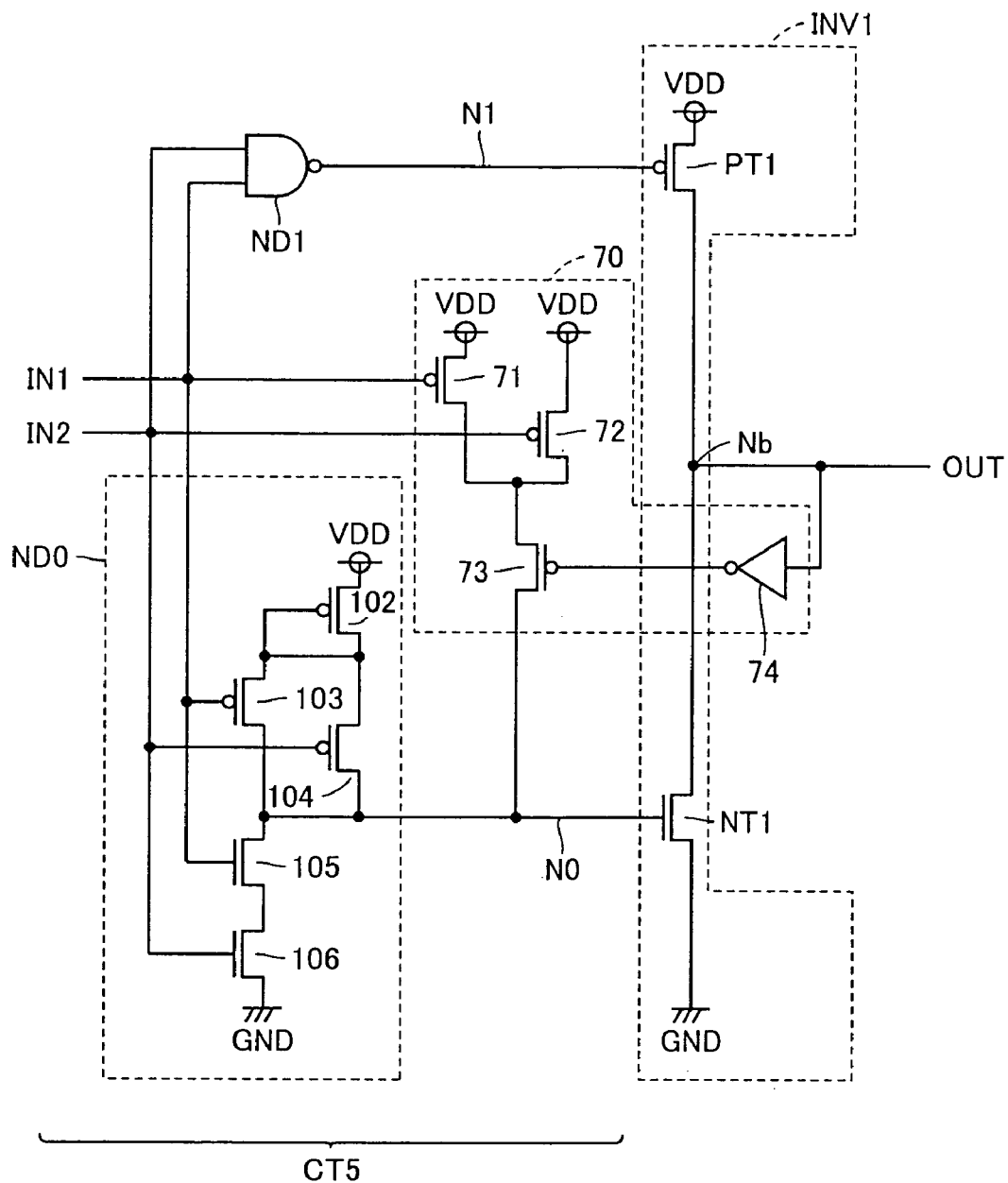
FIG. 12 is a circuit block diagram of a driver circuit according to a fifth embodiment of the present invention.

Referring to FIG. 12, driver circuit 500 according to the fifth embodiment of the present invention includes NAND circuits ND0 and ND1, a timing circuit 70 and inverter INV1. In addition, NAND circuits ND0 and ND1 and timing circuit 70 constitutes a control circuit CT5 which controls the voltage levels of nodes N0 and N1.

NAND circuit ND0 includes transistors 102 to 106. Transistors 105 and 106 are connected in series between node N0 and ground voltage GND and the gates thereof receive inputs of input signals IN1 and IN2, respectively. Transistor 102 is a so-called diode-connected transistor in which a source side is connected to power supply voltage VDD and a gate and a drain are electrically coupled to each other. It is assumed herein that the threshold voltage of transistor 102 is 0.4 V. Transistors 103 and 104 are arranged in parallel between power supply voltage VDD and node N0 and the gates thereof receives inputs of input signals IN1 and IN2, respectively. NAND circuit ND0 outputs its NAND logic operation result to node N0 in accordance with the inputs of input signals IN1 and IN2. In addition, NAND circuit ND1 outputs its NAND logic operation result to node N1 in accordance with the inputs of input signals IN1 and IN2. If input signals IN1 and IN2 are both set at "H" level, for example, node N1 is set at "L" level, i.e., set at 0 V. If one of input signals IN1 and IN2 is at "H" level, node N1 is set at "H" level, i.e., at 1 V.

Timing circuit 70 includes transistors 71 to 73 and an inverter 74. Transistors 71 and 72 are arranged in parallel between power supply voltage VDD and transistor 73 and receive inputs of input signals IN1 and IN2, respectively. Transistor 73 is arranged between transistors 71, 72 and node N0 and the gate thereof receives the input of the inverted signal of output signal OUT through inverter 74.

Figure 13:
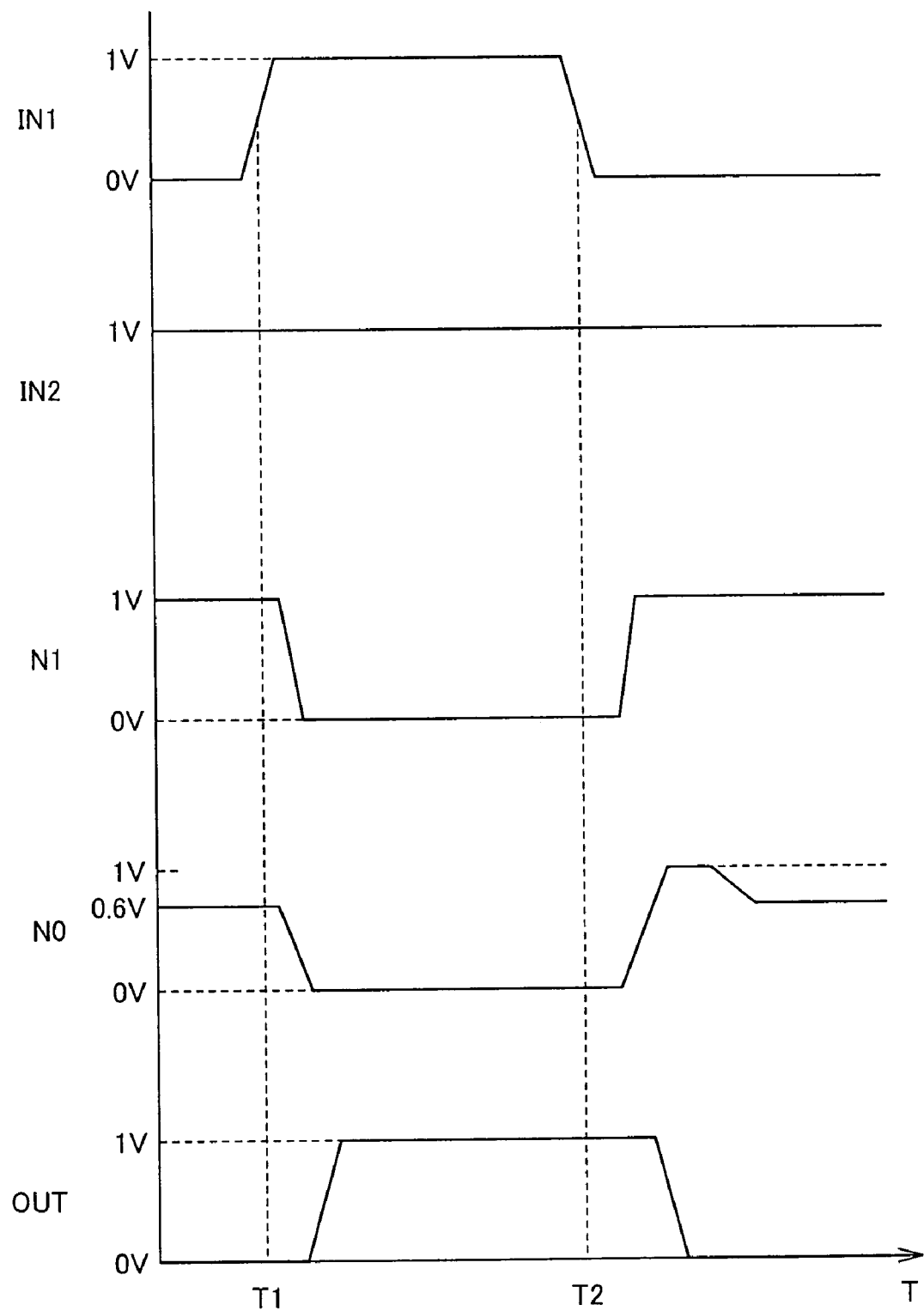
FIG. 13 is a timing chart showing the operation of the driver circuit according to the fifth embodiment.

Referring to the timing chart of FIG. 13, the operation of driver circuit 500 according to the fifth embodiment of the present invention will be described. In an initial state, input signal IN1 is assumed to be 0 V and input signal IN2 is assumed to be 1 V.

A case where input signal IN changes from 0 V to 1 V at time T1 will be considered. Since input signals IN1 and IN2 are both set at 1 V, NAND circuit ND1 sets the voltage level of node N1 at 0 V, accordingly. In NAND circuit ND0, transistors 105 and 106 are turned on in response to input signals IN1 and IN2. Therefore, ground voltage GND is electrically coupled to node N0 and the voltage level of node N0 becomes 0 V. Accordingly, transistor PT1 of inverter INV1 is turned on and power supply voltage VDD is electrically coupled to node Nb. As a result, the voltage level of node Nb is set at 1 V.

On the other hand, transistor 73 of timing circuit 70 receives the input of inverted signal of output signal OUT through inverter 74. Therefore, if output signal OUT is at "H" level, transistor 73 is set to be conductive.

A case where input signal IN changes from 1 V to 0 V at time T2 will be considered. In this case, NAND circuit ND1 sets node N1 at 1 V in response to input signals IN1 and IN2. NAND circuit ND0 turns on transistor 103 in response to input signal IN1 which is 0 V and input signal IN2 which is 1 V. That is, power supply voltage VDD is electrically coupled to node N0 through transistor 102. Therefore, the voltage level of node N0 moves toward 0.6 V.

On the other hand, in timing circuit 70, transistor 71 is turned on in response to input signal IN1 which is 0 V. In this case, transistor 73 is in a conductive state. Therefore, power supply voltage VDD is electrically coupled to node N0. Therefore, the voltage level of node N0 is eventually set at 1 V.

Accordingly, transistor NT1 of inverter INV1 is turned on and ground voltage GND is electrically coupled to node Nb. Therefore, the voltage level of node Nb is set at 0 V.

After time T4 at which output signal OUT becomes 0 V, timing circuit 10 turns off transistor 73 and electrically disconnects power supply voltage VDD from node N0. In a stationary state where output signal OUT is 0 V, therefore, the gate voltage of transistor NT1 is dropped to 0.6 V. It is thereby possible to decrease the gate leak current of transistor NT1.

With the configuration of driver circuit 500 according to the fifth embodiment of the present invention, even in the driver circuit which has two input signals of IN1 and IN2, it is possible to decrease the leak current of transistor NT1 which constitutes inverter INV1 in the final stage and to decrease overall power consumption.

Modification of Fifth Embodiment

In a modification of the fifth embodiment of the present invention, the circuit configuration of a driver circuit 510 in which output signal OUT which is an OR logic operation result is outputted in response to two inputs, i.e., input signals IN1 and IN2 will be described.

Figure 14:
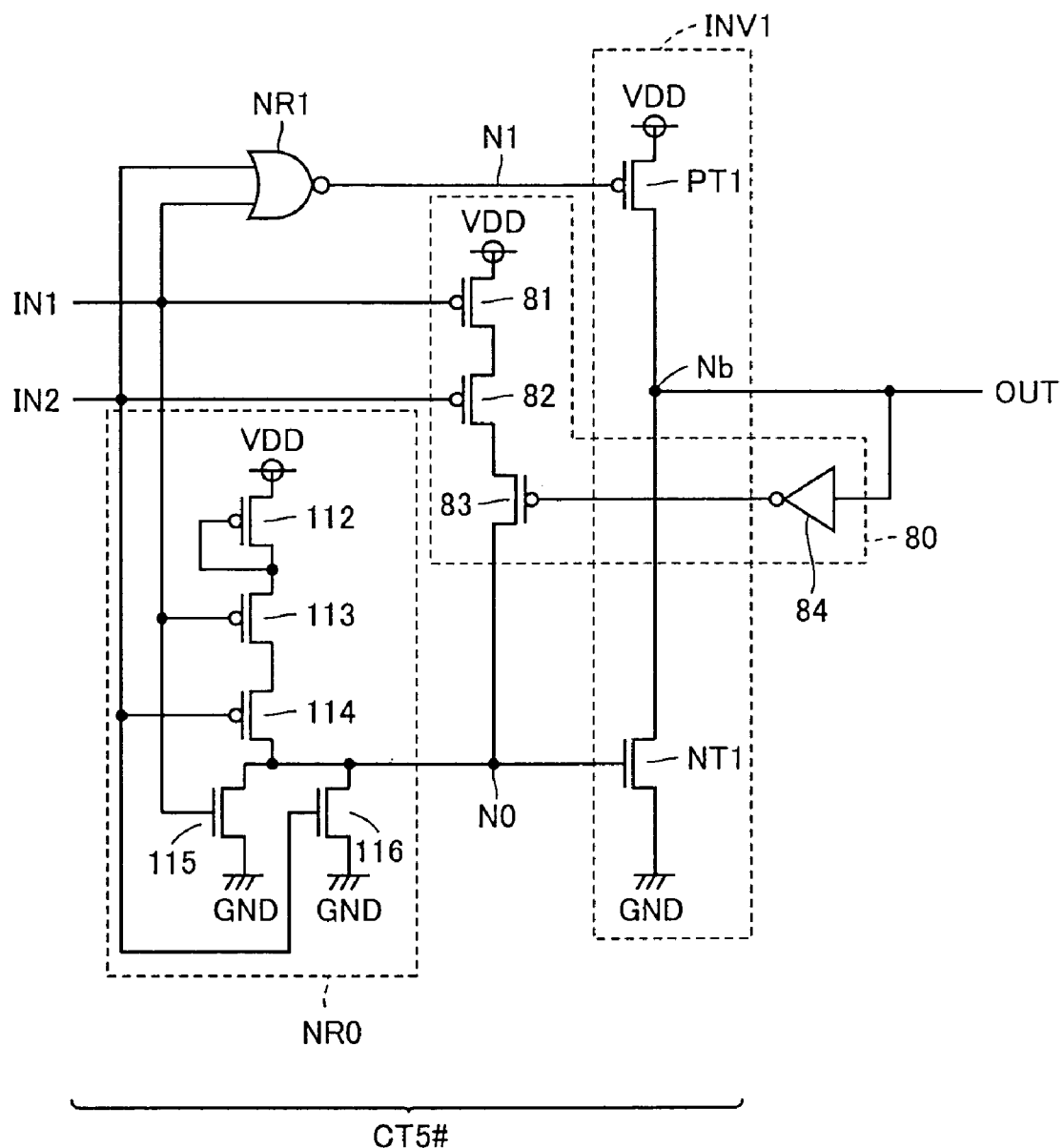
FIG. 14 is a circuit block diagram of a driver circuit according to a modification of the fifth embodiment of the present invention.

Referring to FIG. 14, driver circuit 510 according to the modification of the fifth embodiment differs from driver circuit 500 according to the fifth embodiment shown in FIG. 12 in that NAND circuits ND0 and ND1 are replaced by NOR circuits NR0 and NR1 and timing circuit 70 is replaced by a timing circuit 80. In addition, NOR circuits NR0 and NR1 and timing circuit 80 constitutes a control circuit CT5# which controls the voltage levels of nodes N0 and N1.

NOR circuit NR1 receives inputs of input signals IN1 and IN2 and outputs its NOR logic operation result to node N1. NOR circuit NR0 includes transistors 112 to 116. It is assumed herein that transistors 112 to 114 are P-channel MOS transistors as one example. It is also assumed herein that transistors 115 and 116 are N-channel MOS transistors. Transistors 115 and 116 are arranged in parallel between node N0 and ground node GND and the gates thereof receive inputs of input signals IN1 and IN2, respectively. Transistor 112 is a so-called diode-connected transistor in which a source side is connected to power supply voltage VDD and a gate and a drain are electrically coupled to each other. Transistors 113 and 114 are connected in series between power supply voltage VDD and node N0 through transistor 112 and the gates thereof receive inputs of input signals IN1 and IN2, respectively.

Timing circuit 80 includes transistors 81 to 83 and an inverter 84. It is assumed herein that transistors 81 to 83 are P-channel MOS transistors as one example. Transistors 81 and 82 are connected in series between node N0 and power supply voltage VDD through transistor 83 and the gates thereof receive inputs of input signals IN1 and IN2, respectively. In addition, transistor 83 is arranged between transistor 82 and node N0 and receives the input of the inverted signal of output signal OUT through inverter 84.

Figure 15:
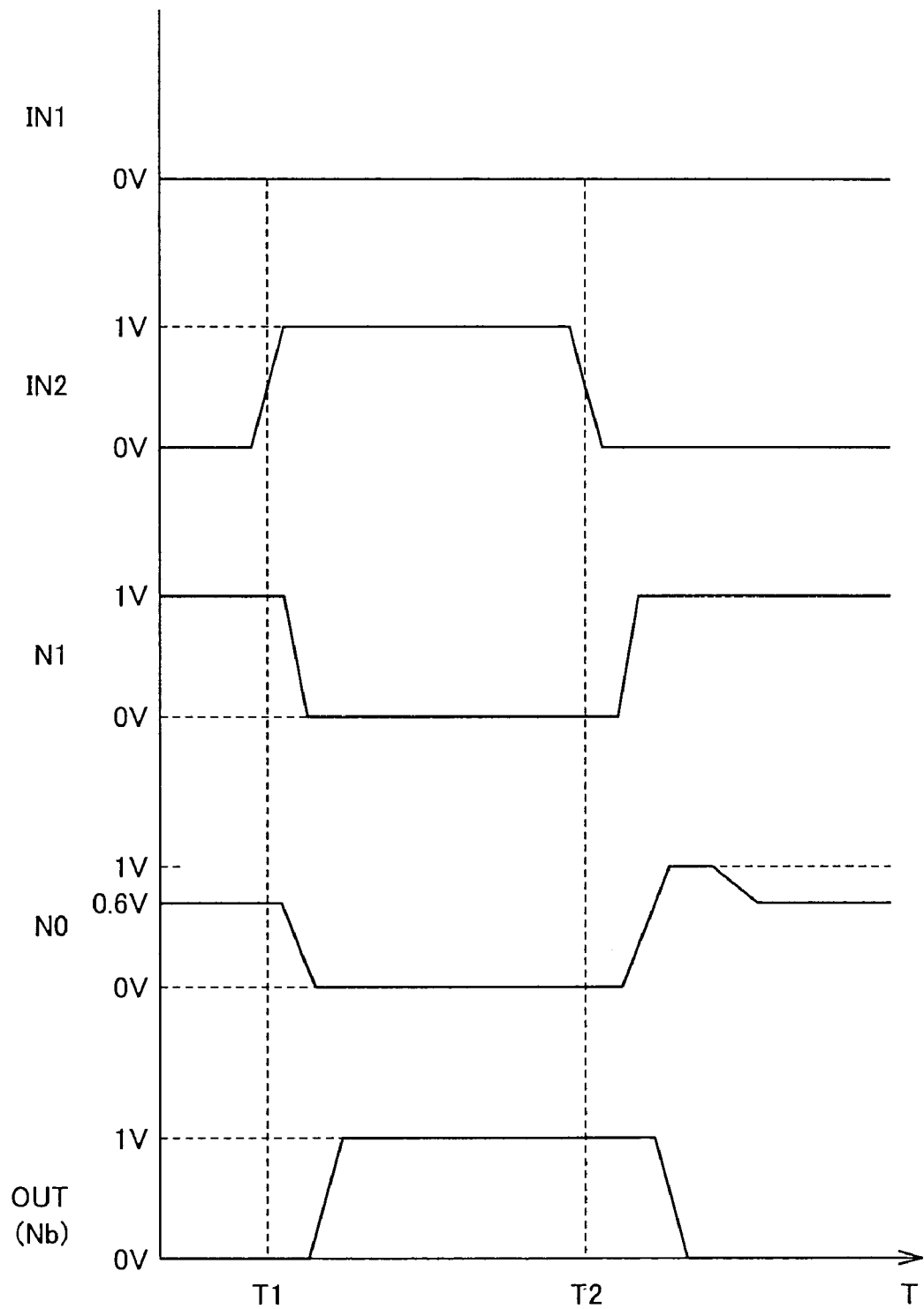
FIG. 15 is a timing chart showing the operation of the driver circuit according to the modification of the fifth embodiment of the present invention.

Referring to the timing chart of FIG. 15, the operation of driver circuit 510 according to the modification of the fifth embodiment of the present invention will be described. In an initial state, input signals IN1 and IN2 are assumed to be 0 V.

A case where input signal IN2 changes from 0 V to 1 V at time T1 will be considered. Since input signal IN1 is 0 V and input signal IN2 is 1 V, NOR circuit NR1 sets the voltage level of node N1 at 0 V, accordingly. In NOR circuit NR0, transistor 116 is turned on in response to input signals IN1 and IN2. Therefore, ground voltage GND is electrically coupled to node N0 and the voltage level of node N0 becomes 0 V. Accordingly, transistor PT1 of inverter INV1 is turned on and power supply voltage VDD is electrically coupled to node Nb. Therefore, the voltage level of node Nb is set at 1 V.

On the other hand, transistor 83 of timing circuit 80 receives the input of the inverted signal of output signal OUT through inverter 74. Therefore, if output signal OUT is at "H" level, transistor 83 is set to be conductive.

A case where input signal IN2 changes from 1 V to 0 V at time T2 will be considered. In this case, NOR circuit NR1 sets node N1 at 1 V in response to input signals IN1 and IN2. NOR circuit NR0 turns on transistors 113 and 114 in response to input signal IN1 which is 0 V and input signal IN2 which is 0 V. That is, power supply voltage VDD is electrically coupled to node N0 through transistor 112. Therefore, the voltage level of node N0 moves toward 0.6 V.

On the other hand, in timing circuit 70, transistors 81 and 82 are turned on in response to input signals IN1 and IN2 which are both 0 V. In this case, transistor 83 is in a conductive state. Therefore, power supply voltage VDD is electrically coupled to node N0. Therefore, the voltage level of node N0 is eventually set at 1 V.

Accordingly, transistor NT1 of inverter INV1 is turned on and ground voltage GND is electrically coupled to node Nb. The voltage level of node Nb is, therefore, set at 0 V.

After time T4 at which output signal OUT becomes 0 V, timing circuit 10 turns off transistor 83 and electrically disconnects power supply voltage VDD from node N0. In a stationary state where output signal OUT is 0 V, therefore, the gate voltage of transistor NT1 is dropped to 0.6 V. It is thereby possible to decrease the gate leak current of transistor NT1.

With the configuration of driver circuit 510 according to the modification of the fifth embodiment of the present invention, even in the driver circuit which has two input signals of IN1 and IN2, it is possible to decrease the leak current of transistor NT1 which constitutes inverter INV1 in the final stage and to decrease overall power consumption.

Sixth Embodiment

In each of the first to fifth embodiments and the modifications thereof, the description has been given of the method for decreasing the gate leak current of the transistor which constitutes the inverter in the final stage by setting the gate voltage of the transistor which constitutes the inverter in the final stage at intermediate voltage level in the configuration of the driver circuit.

In the sixth embodiment of the present invention, description will be given of the configuration of a driver circuit 600, in which power consumption is further decreased by dropping a gate voltage applied to the gate of transistor NT1 completely to ground voltage GND level while transistor NT1 does not operate.

Figure 16:
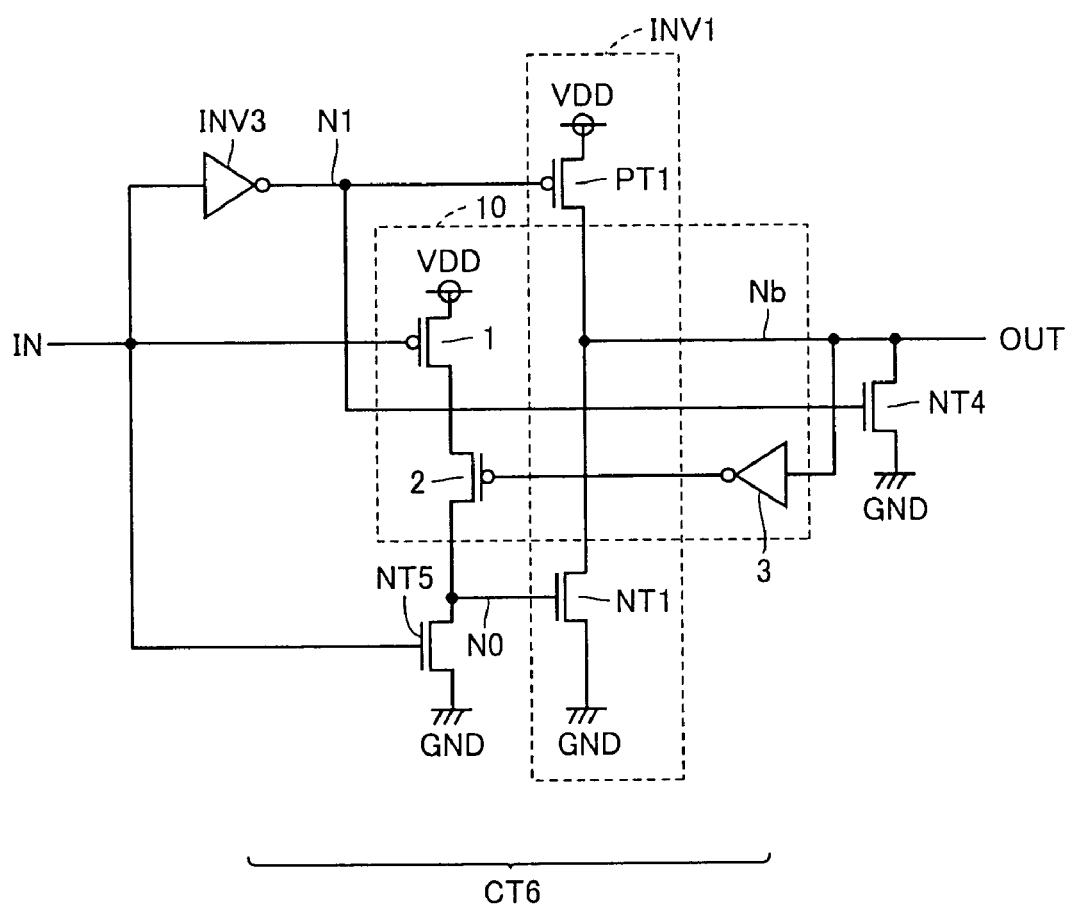
FIG. 16 is a circuit block diagram of a driver circuit according to a sixth embodiment of the present invention.

Referring to FIG. 16, driver circuit 600 according to the sixth embodiment of the present invention differs from driver circuit 200 shown in FIG. 4 in that inverter INV2 is deleted and transistors NT4 and NT5 are newly provided. Since other inverters INV1 and INV3 are equal in configuration to those of driver circuit 200 according to the second embodiment shown in FIG. 4, they will not be repeatedly described herein. Inverter INV3 and timing circuit 10 constitutes a control circuit CT6 which controls the voltage levels of nodes N0 and N1.

Transistor NT5 is arranged between node N0 and ground voltage GND and the gate thereof receives the input of input signal IN. Transistor NT4 is arranged in parallel to transistor NT1 between node Nb and ground voltage GND and the gate thereof is electrically connected to node N1.

By way of example, it is assumed herein that transistors NT4 and NT5 are N-channel MOS transistors. It is assumed that the current driving forces of transistors NT4 and NT5 are lower than that of transistor NT1. Specifically, it is assumed that the gate width of each of transistors NT4 and NT5 is smaller than that of transistor NT1.

Figure 17:
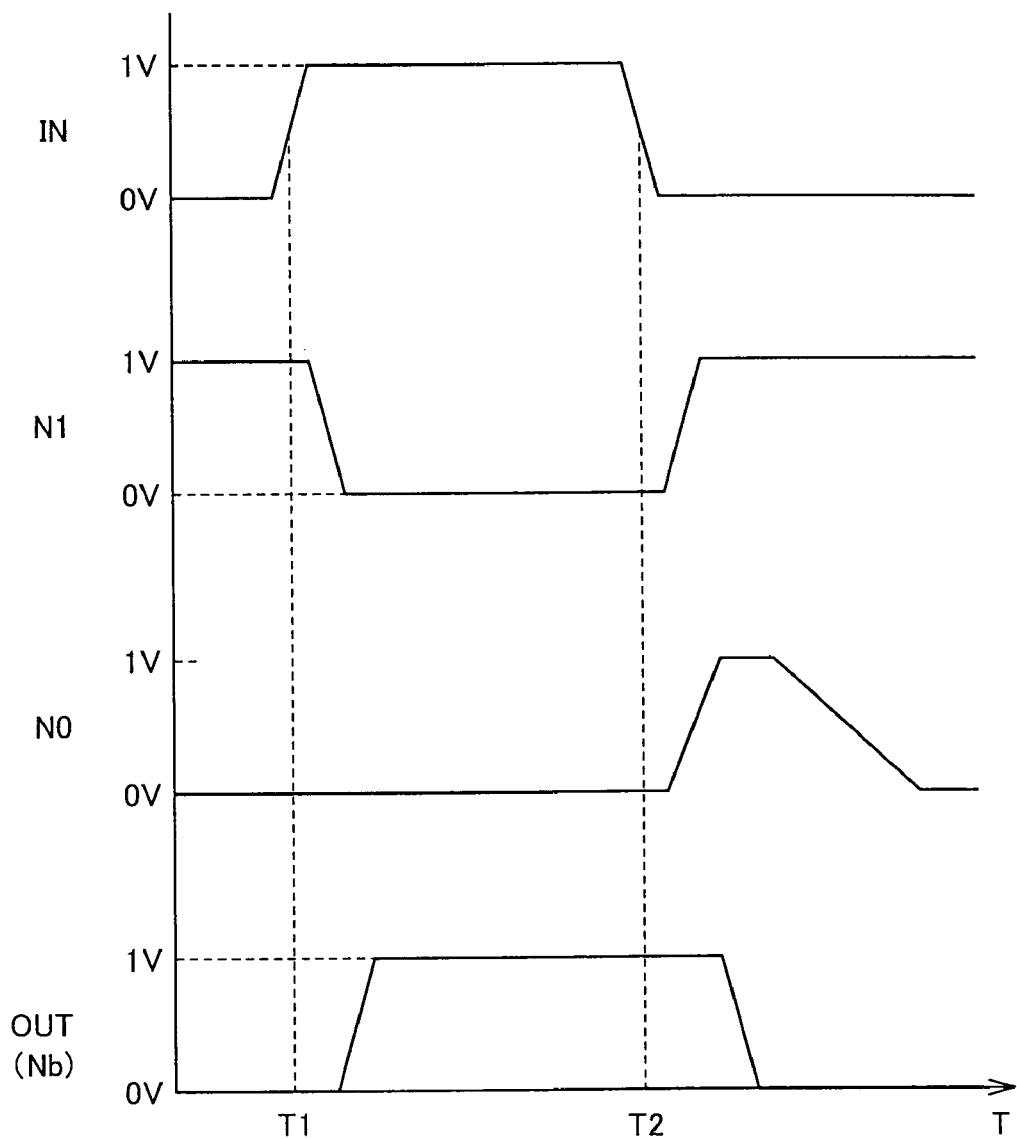
FIG. 17 is a timing chart showing the operation of the driver circuit according to the sixth embodiment of the present invention.

Referring to the timing chart of FIG. 17, the operation of driver circuit 600 according to the sixth embodiment of the present invention will be described.

A case where input signal IN changes from 0 V to 1 V at time T1 will be considered. Inverter INV3 transmits the inverted signal of input signal IN to node N1. That is, node N1 is electrically coupled to ground voltage GND and the voltage level of node N1 is set at 0 V. In response to this, transistor PT1 of inverter INV1 is turned on and power supply voltage VDD is electrically coupled to node Nb. The voltage level of node Nb, therefore, becomes 1 V. Transistor NT5 electrically couples ground voltage GND to node N0 in response to input signal IN. The voltage level of node N0 is, therefore, set at 0 V.

On the other hand, timing circuit 10 does not function at time T1 since transistor 1 is set nonconductive in response to input signal IN as in the case of the second embodiment described above. In this case, since the voltage level of node Nb is set at 1 V, transistor 2 of timing circuit 10 is conductive in response to the inverted signal (0 V) of inverter 3.

A case where input signal IN changes from 1 V to 0 V at time T2 will next be considered. Inverter INV3 transmits the inverted signal of input signal IN to node N1. That is, node N1 is electrically coupled to power supply voltage VDD and the voltage level of node N1 changes from 0 V to 1 V. Accordingly, transistor PT1 of inverter INV1 is turned off.

On the other hand, transistor 2 of timing circuit 10 is turned on as described above. Due to this, at time T2, when input signal IN changes from 1 V to 0 V, transistor 1 is turned on. Accordingly, similarly to the above described with reference to the timing chart of FIG. 5, transistors 1 and 2 are turned on, thus electrically coupling power supply voltage VDD to node N0. The voltage level of node N0 is therefore set at 1 V. In response to this, transistor NT1 of inverter INV1 is turned on, ground voltage GND is electrically coupled to node Nb, and the voltage level of node Nb is set at 0 V ("L" level).

Thereafter, when the voltage level of node Nb changes to 0 V, timing circuit 10 turns off transistor 2. That is, the supply of power supply voltage VDD (1 V) from timing circuit 10 to node N0 is stopped.

When timing circuit 10 operates as described above, then transistor NT4 is turned on in response to the setting of the voltage level of node N1 at 1 V, ground voltage GND is electrically coupled to node Nb, and the voltage level of node Nb is set at 0 V.

Therefore, in the period that input signal IN changes from 1 V to 0 V, both of transistors NT1 and NT4 are turned on. In the transition period that output signal OUT changes from 1 V to 0 V, transistor NT1 having high operation rate is turned on for a predetermined period. Therefore, the rate of transistor NT1 is kept high. In a stationary period after output signal OUT is set at 0 V, the voltage of node Nb is fixed to 0 V using transistor NT4.

That is, data level is changed at high rate temporarily using transistor NT1 having high leak current. In the stationary state, data level is fixed using the low-rate transistor having low leak current.

In this state, node N0 turns into a floating state since the supply of power supply voltage VDD from timing circuit 10 is stopped as described above. The voltage level of node N0 is slowly lowered to ground voltage GND level by the gate leak of transistor NT1, and transistor NT1 is turned off.

In driver circuit 600 according to the sixth embodiment of the present invention, two types of transistors having different current driving forces are employed to ensure the high-rate operation of driver circuit 600 and to set the gate voltage of transistor NT1 having high leak current at 0 V while transistor NT1 is inoperative, whereby it is possible to further decrease the leak current of transistor NT1 and eventually decrease the overall leak current of driver circuit 600.

First Modification of Sixth Embodiment

Referring to FIG. 18, a driver circuit 610 according to a first modification of the sixth embodiment of the present invention differs from driver circuit 600 according to the sixth embodiment described with reference to FIG. 16 in that timing circuit 10 is replaced by a timing circuit 40. Timing circuit 40 includes a transistor 41 and an inverter 42. Inverter IV3 and timing circuit 40 constitutes a control circuit CT6# which controls the voltage levels of nodes N0 and N1.

Similarly to timing circuit 20, timing circuit 40 temporarily, electrically couples power supply voltage VDD to node N0 when transistor NT1 is turned on. Specifically, when output signal OUT is 1 V (at "H" level), transistor 41 is turned on and nodes N1 and N0 are electrically coupled to each other.

The operation of driver circuit 610 according to the first modification of the sixth embodiment of the present invention is equal to that of driver circuit 600 according to the sixth embodiment described with reference to FIG. 17.

Specifically, when input signal IN changes from 1 V to 0 V, output signal OUT is 1 V. In timing circuit 40, therefore, transistor 41 sets nodes N0 and N1 to be made electrically conductive. Inverter INV3 electrically couples node N1 to power supply voltage VDD (1 V) in response to the change of input signal IN from 1 V to 0 V. Accordingly, node N0 is electrically coupled to power supply voltage VDD. In response to this, transistor NT1 of inverter INV1 is turned on and node Nb is electrically coupled to ground voltage GND (0 V). Timing circuit 40 disconnects node N1 from node N0, accordingly. Further, in response to the change of node N1 to 1 V, transistor NT4 is turned on and node Nb is electrically coupled to ground voltage GND.

As a result, as described above, in the period that input signal IN changes from 1 V to 0 V, both of transistors NT1 and NT4 are turned on. That is, data level is changed at high rate temporarily using transistor NT1 having high leak current. In a stationary state, data level is fixed using the low-rate transistor having low leak current.

In this state, node N0 turns into a floating state since the supply of power supply voltage VDD is stopped as described above. The voltage level of node N0 slowly is lowered to ground voltage GND level by the gate leak of transistor NT1, and transistor NT1 is turned off.

In driver circuit 610 according to the first modification of the sixth embodiment of the present invention, two types of transistors having different current driving forces are employed to ensure the high-rate operation of driver circuit 610 and to set the gate voltage of transistor NT1 having high leak current at 0 V while transistor NT1 is inoperative, whereby it is possible to further decrease the leak current of transistor NT1 and eventually decrease the overall leak current of driver circuit 610.

Second Modification of Sixth Embodiment

In a second modification of the sixth embodiment of the present invention, description will be given of the configuration of a driver circuit which outputs an AND logic operation result in response to the input signals of two inputs described in the fifth embodiment with reference to FIG. 12, in which a gate voltage applied to the gate of transistor NT1 is completely dropped to ground voltage GND level when transistor NT1 does not operate, thereby further decreasing power consumption.

Figure 19:
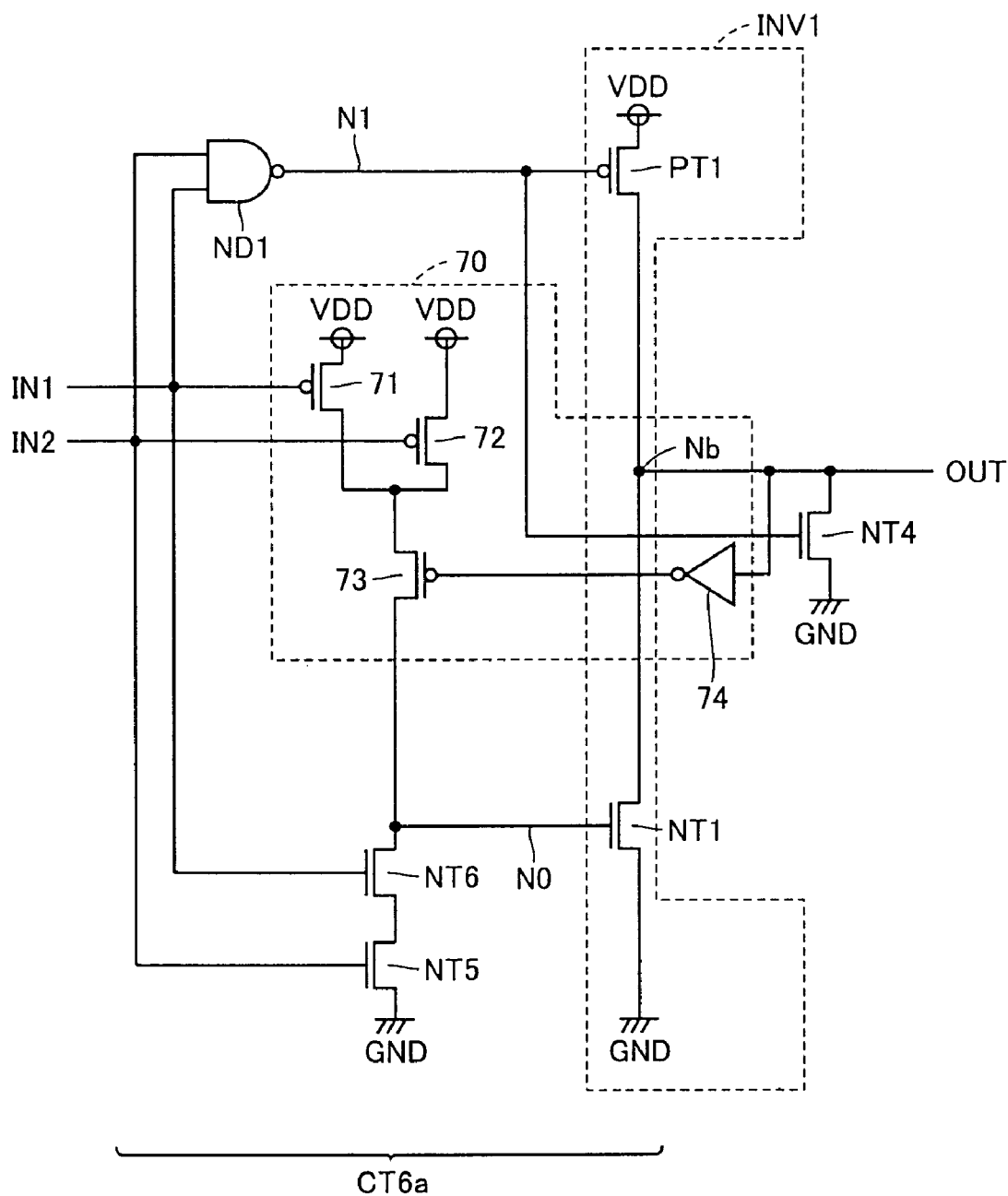
FIG. 19 is a circuit block diagram of a driver circuit according to a second modification of the sixth embodiment of the present invention.

Referring to FIG. 19, a driver circuit 620 according to the second modification of the sixth embodiment differs from driver circuit 500 shown in FIG. 12 in that NAND circuit ND0 is deleted and transistors NT4 to NT6 are newly provided. In addition, NAND circuit ND1 and timing circuit 70 constitute a control circuit CT6a which controls the voltage levels of nodes N0 and N1. By way of example, it is assumed that transistors NT4 to NT6 are N-channel MOS transistors. It is also assumed that the current driving forces of transistors NT4 to NT6 are lower than that of transistor NT1. Specifically, it is assumed that the gate width of each of transistors NT4 and NT6 is smaller than that of transistor NT1.

Transistor NT4 is arranged in parallel to transistor NT1, between node Nb and ground voltage GND, and the gate thereof is electrically coupled to node N1. Transistors NT5 and NT6 are connected in series between node N0 and ground voltage GND and the gates thereof receive input signals IN2 and IN1, respectively.

As described above, NAND circuit ND1 outputs a NAND logic operation result to node N1 in accordance with the inputs of input signals IN1 and IN2. When input signals IN1 and IN2 are both set at "H" level, for example, node N1 is set at "L" level, i.e., 0 V. When either input signal IN1 or IN2 is set at "L" level, for example, node N1 is set at "H" level, i.e., 1 V.

Timing circuit 70 adjusts the voltage level of node N0 for a predetermined period as described above.

Figure 20:
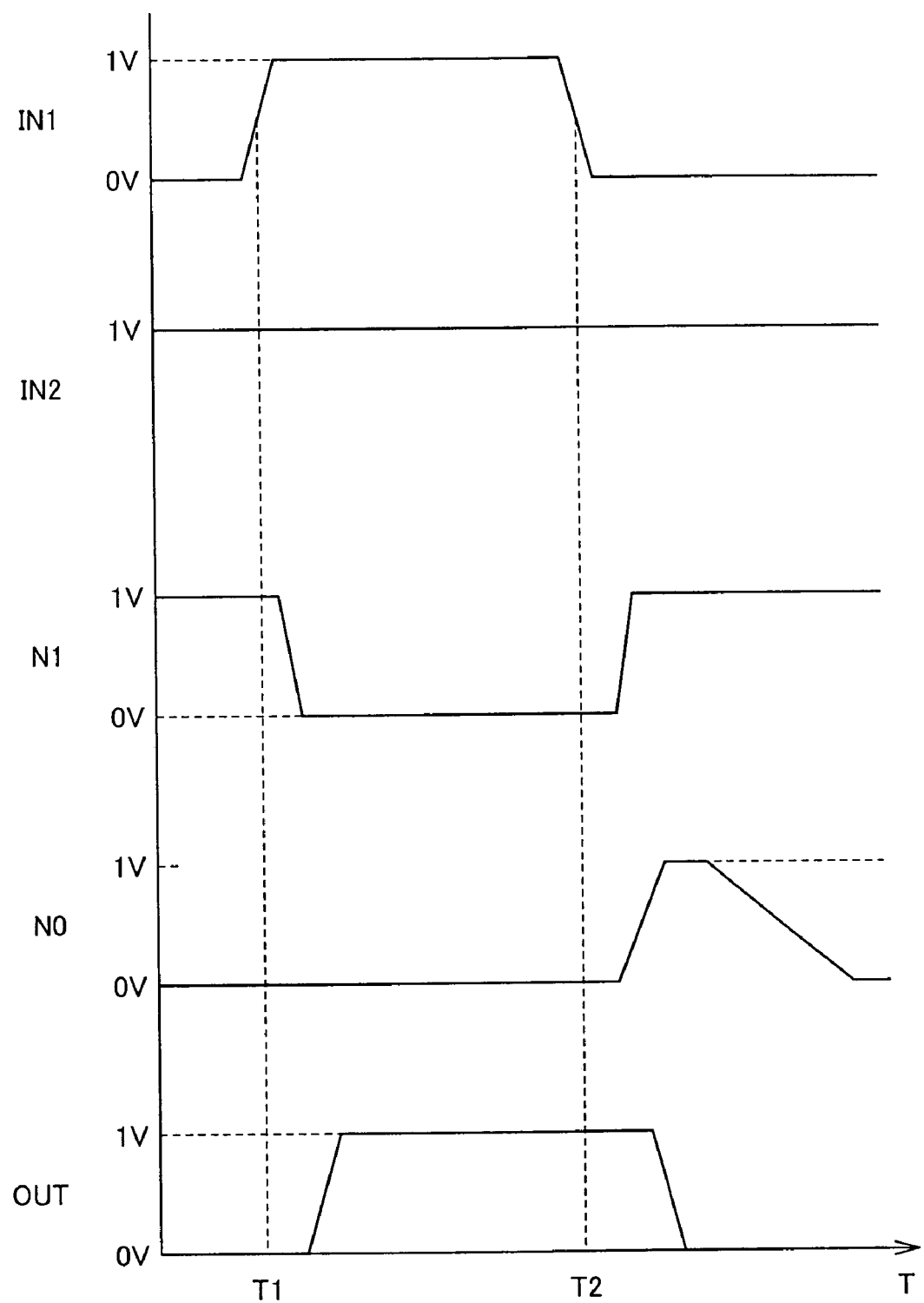
FIG. 20 is a timing chart showing the operation of the driver circuit according to the second modification of the sixth embodiment of the present invention.

Referring to the timing chart of FIG. 20, the operation of driver circuit 620 according to the second modification of the sixth embodiment of the present invention will be described. In an initial state, input signals IN1 and IN2 are assumed to be 0 V and 1 V, respectively.

A case where input signal IN 1 changes from 0 V to 1 V at time T1 will be considered. Similarly to the case described with reference to FIG. 11, since input signals IN1 and IN2 are both set at 1 V, NAND circuit ND1 sets the voltage level of node N1 at 0 V, accordingly. In response to this, in inverter INV1, transistor PT1 is turned on and power supply voltage VDD is electrically coupled to node Nb. Therefore, the voltage level of node Nb is set at 1 V.

Further, transistors NT5 and NT6 are turned on in response to input signals IN2 and IN1 (1 V), respectively. Therefore, ground voltage GND is electrically coupled to node N0 and the voltage level of node N0 becomes 0 V.

On the other hand, transistor 73 of timing circuit 70 is set conductive when output signal OUT is at "H" level similarly to the case described with reference to the timing chart of FIG. 11.

A case where input signal IN1 changes from 1 V to 0 V at time T2 will be considered. In this case, NAND circuit ND1 sets node N1 at 1 Vin response to input signals IN1 and IN2. Therefore, transistor PT1 is turned off.

In timing circuit 70, transistor 71 is turned on in response to the change of input signal IN1 to 0 V. In this case, transistor 73 is conductive. Therefore, power supply voltage VDD is electrically coupled to node N0. As a result, the voltage level of node N0 is set at 1 V.

Accordingly, transistor NT1 of inverter INV1 is turned on and ground voltage GND is electrically coupled to node Nb. Therefore, the voltage level of node Nb is set at 0 V.

Next, after the time at which output signal OUT becomes 0 V, timing circuit 70 turns off transistor 73 to electrically disconnect power supply voltage VDD from node N0.

Accordingly, the supply of voltage to node N0 is stopped and transistor NT1 is turned off.

When timing circuit 70 operates as described above, then transistor NT4 is turned on in response to the setting of the voltage level of node N1 at 1 V, ground voltage GND is electrically coupled to node Nb, and the voltage level of node Nb is thereby set at 0 V.

Therefore, in the period that input signal IN changes from 1 V to 0 V, both of transistors NT1 and NT4 are turned on. In the transition period that output signal OUT changes from 1 V to 0 V, transistor NT1 having high operation rate is turned on for a predetermined period. Therefore, the rate of transistor NT1 is kept high. In a stationary period after output signal OUT is set at 0 V, the voltage of node Nb is fixed to 0 V using transistor NT4.

That is, data level is changed at high rate temporarily using transistor NT1 having high leak current. In the stationary state, data level is fixed using the low-rate transistor having low leak current.

In this state, node N0 turns into a floating state since the supply of voltage is stopped. The voltage level of node N0 is slowly lowered to ground voltage GND level by the gate leak of transistor NT1, and transistor NT1 is turned off.

In driver circuit 620 which has a two-input AND circuit configuration according to the second modification of the sixth embodiment of the present invention, similarly to the above, two types of transistors having different current driving forces are employed to ensure the high-rate operation of driver circuit 620 and to set the gate voltage of transistor NT1 having high leak current at 0 V while transistor NT1 is inoperative, whereby it is possible to further decrease the leak current of transistor NT1 and eventually decrease the overall leak current of driver circuit 620.

Third Modification of Sixth Embodiment

In a third modification of the sixth embodiment of the present invention, description will be given of the configuration that a driver circuit 630 which outputs output signal OUT as an OR logic operation result in response to input signals IN1 and IN2 of two inputs.

Figure 21:
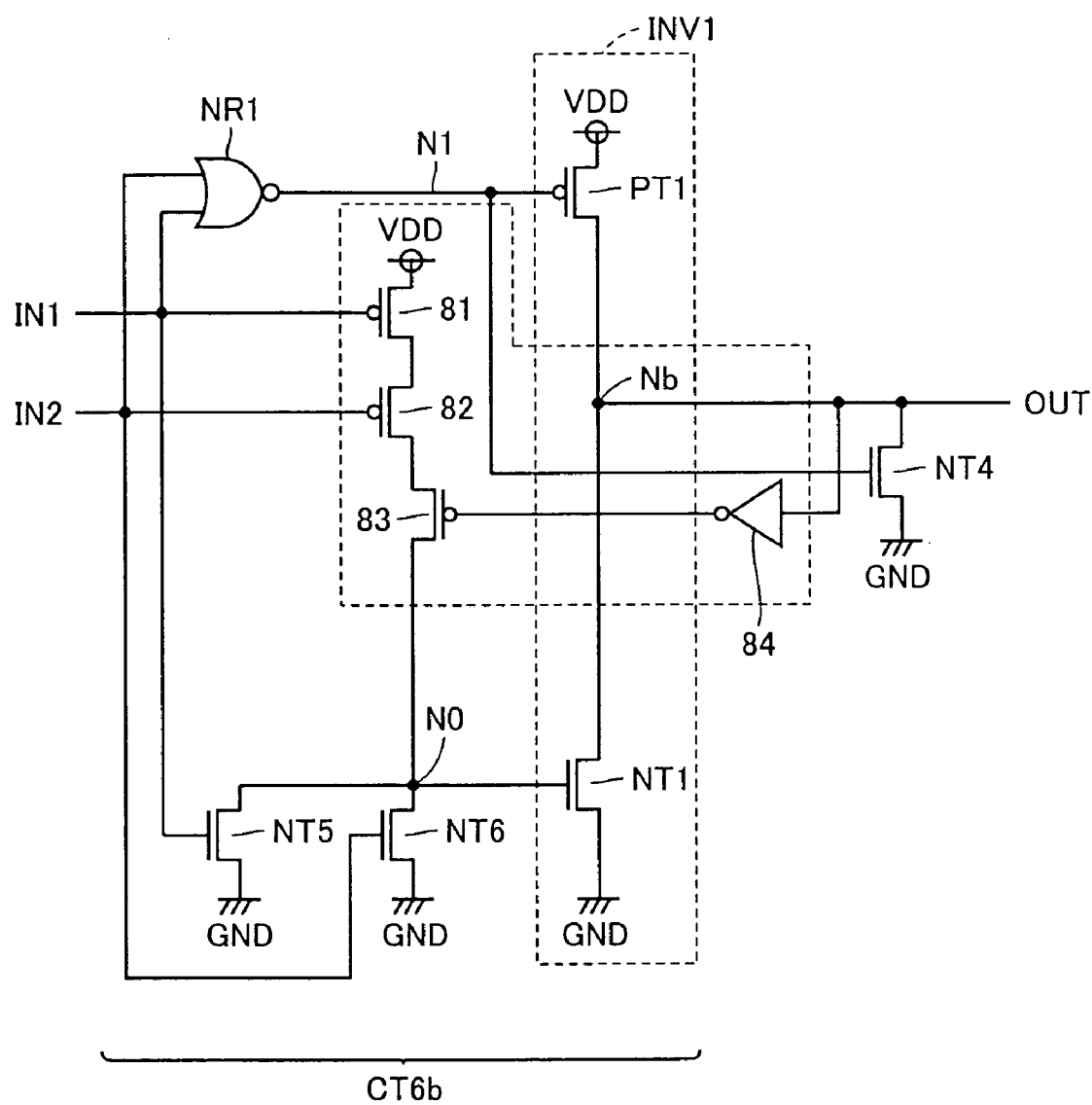
FIG. 21 is a circuit block diagram of a driver circuit having a configuration of a two-input OR circuit according to a third modification of the sixth embodiment of the present invention.

Referring to FIG. 21, driver circuit 630 according to the third modification of the sixth embodiment differs from driver circuit 510 according to the modification of the fifth embodiment shown in FIG. 14 in that NOR circuit NR0 is deleted and transistors NT4 to NT6 are newly provided. In addition, NOR circuit NR1 and timing circuit 80 constitutes a control circuit CT6b which controls the voltage levels of nodes N0 and N1.

Transistor NT4 is arranged in parallel to transistor NT1 between node Nb and ground voltage GND and the gate thereof is electrically coupled to node N1. Transistors NT5 and NT6 are connected in parallel between node N0 and ground voltage GND and the gates thereof receive input signals IN1 and IN2, respectively.

Figure 22:
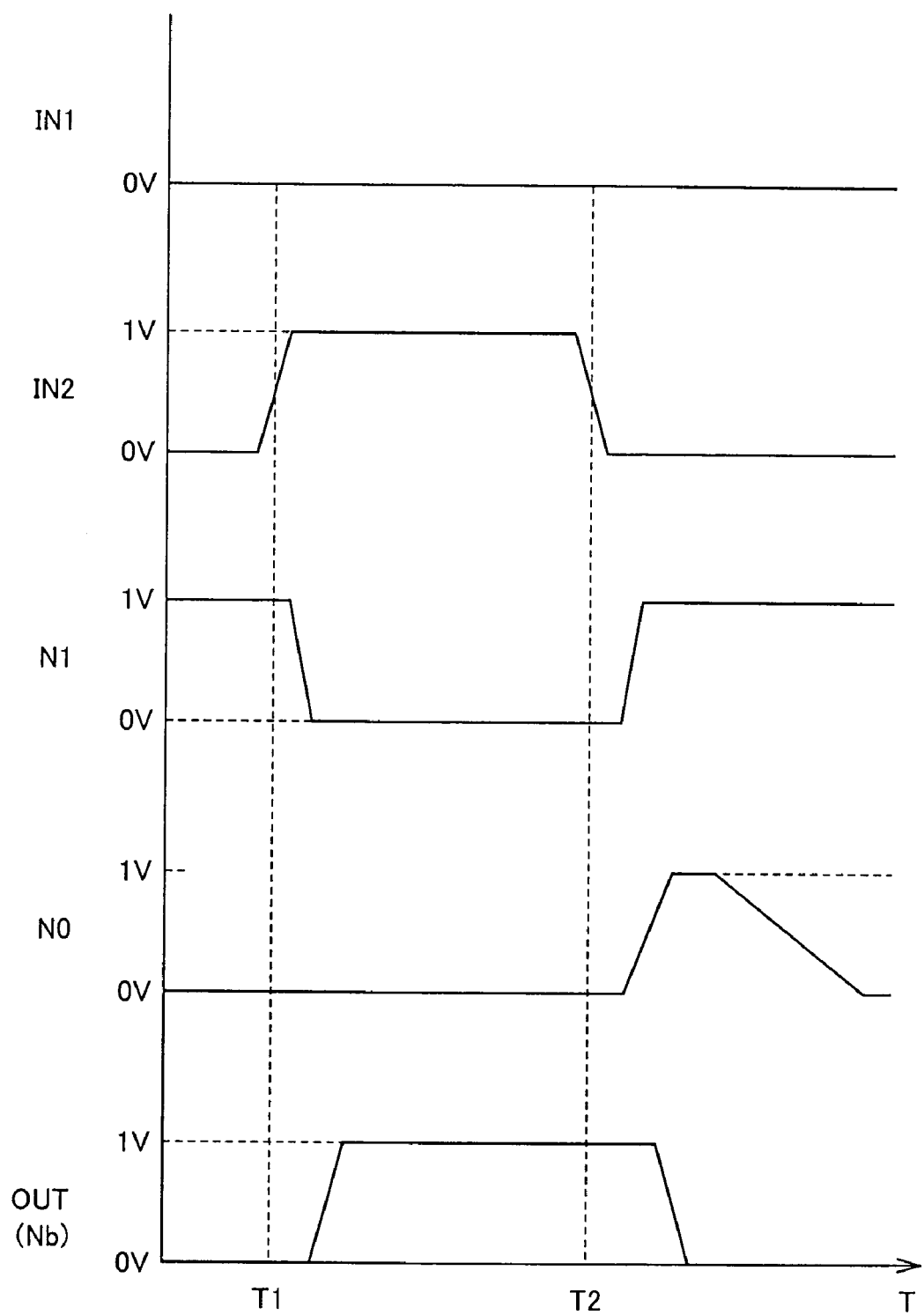
FIG. 22 is a timing chart showing the operation of the driver circuit according to the third modification of the sixth embodiment of the present invention.

Referring to the timing chart of FIG. 22, the operation of driver circuit 630 according to the third modification of the sixth embodiment of the present invention will be described. In an initial state, input signals IN1 and IN2 are assumed to be 0 V.

A case where input signal IN2 changes from 0 V to 1 V at time T1 will be considered. Similarly to the case described with reference to FIG. 15, since input signals IN1 and IN2 are set at 0 V and 1 V, respectively, NOR circuit NR1 sets the voltage level of node N1 at 0 V, accordingly. In response to this, in inverter INV1, transistor PT1 is turned on and power supply voltage VDD is electrically coupled to node Nb. Therefore, the voltage level of node Nb is set at 1 V.

Further, transistor NT6 is turned on in response to input signal IN2 (1 V). Therefore, ground voltage GND is electrically coupled to node N0 and the voltage level of node N0 becomes 0 V.

On the other hand, transistor 83 of timing circuit 80 receives the inverted signal of output signal OUT through inverter 84 similarly to the case described with reference to the timing chart of FIG. 15. Therefore, when output signal OUT is at "H" level, transistor 83 is set conductive.

A case where input signal IN2 changes from 1 V to 0 V at time T2 will be considered. In this case, NOR circuit NR1 sets node N1 at 1 V in response to input signals IN1 and IN2. Therefore, transistor PT1 is turned off.

In timing circuit 80, transistors 81 and 82 are turned on in response to both of input signals IN1 and IN2 set at 0 V. In this case, transistor 83 is conductive. Therefore, power supply voltage VDD is electrically coupled to node N0. As a result, the voltage level of node N0 is set at 1 V.

Accordingly, transistor NT1 of inverter INV1 is turned on and ground voltage GND is electrically coupled to node Nb. Therefore, the voltage level of node Nb is set at 0 V.

After time T4 at which output signal OUT becomes 0 V, timing circuit 80 turns off transistor 83 and electrically disconnects power supply voltage VDD from node N0. Accordingly, the supply of voltage to node N0 is stopped and transistor NT1 is turned off.

When timing circuit 80 operates as described above, then transistor NT4 is turned on in response to the setting of the voltage level of node N1 at 1 V, ground voltage GND is electrically coupled to node Nb, and the voltage level of node Nb is thereby set at 0 V.

Therefore, in a period that input signal IN changes from 1 V to 0 V, both of transistors NT1 and NT4 are turned on. In a transition period that output signal OUT changes from 1 V to 0 V, transistor NT1 having high operation rate is turned on for a predetermined period. Therefore, the rate of transistor NT1 is kept high. In a stationary period after output signal OUT is set at 0 V, the voltage of node Nb is fixed to 0 V using transistor NT4.

That is, data level is changed at high rate temporarily using transistor NT1 having high leak current. In the stationary state, data level is fixed using the low-rate transistor having low leak current.

In this state, node N0 turns into a floating state since the supply of voltage is stopped as described above. The voltage level of node N0 is slowly lowered to ground voltage GND level by the gate leak of transistor NT1, and transistor NT1 is turned off.

In driver circuit 630 which has a two-input OR circuit configuration according to the third modification of the sixth embodiment of the present invention, similarly to the above, two types of transistors having different current driving forces are employed to ensure the high-rate operation of driver circuit. 630 and to set the gate voltage of transistor NT1 having high leak current at 0 V while transistor NT1 is inoperative, whereby it is possible to further decrease the leak current of transistor NT1 and eventually decrease the overall leak current of driver circuit 630.

Seventh Embodiment

In the sixth embodiment, description has been given of the configuration that two types of transistors, i.e., transistor NT1 having a high current driving force and transistor NT4 having a low current driving force are employed to ensure the high-rate operation of the driver circuit and to decrease power consumption.

In a seventh embodiment, description will be given of a configuration that two types of transistors, one having a high current driving force and the other having a low current driving force are also employed in a P-channel MOS transistor to ensure the high-rate operation of the driver circuit and to decrease power consumption.

Figure 23:
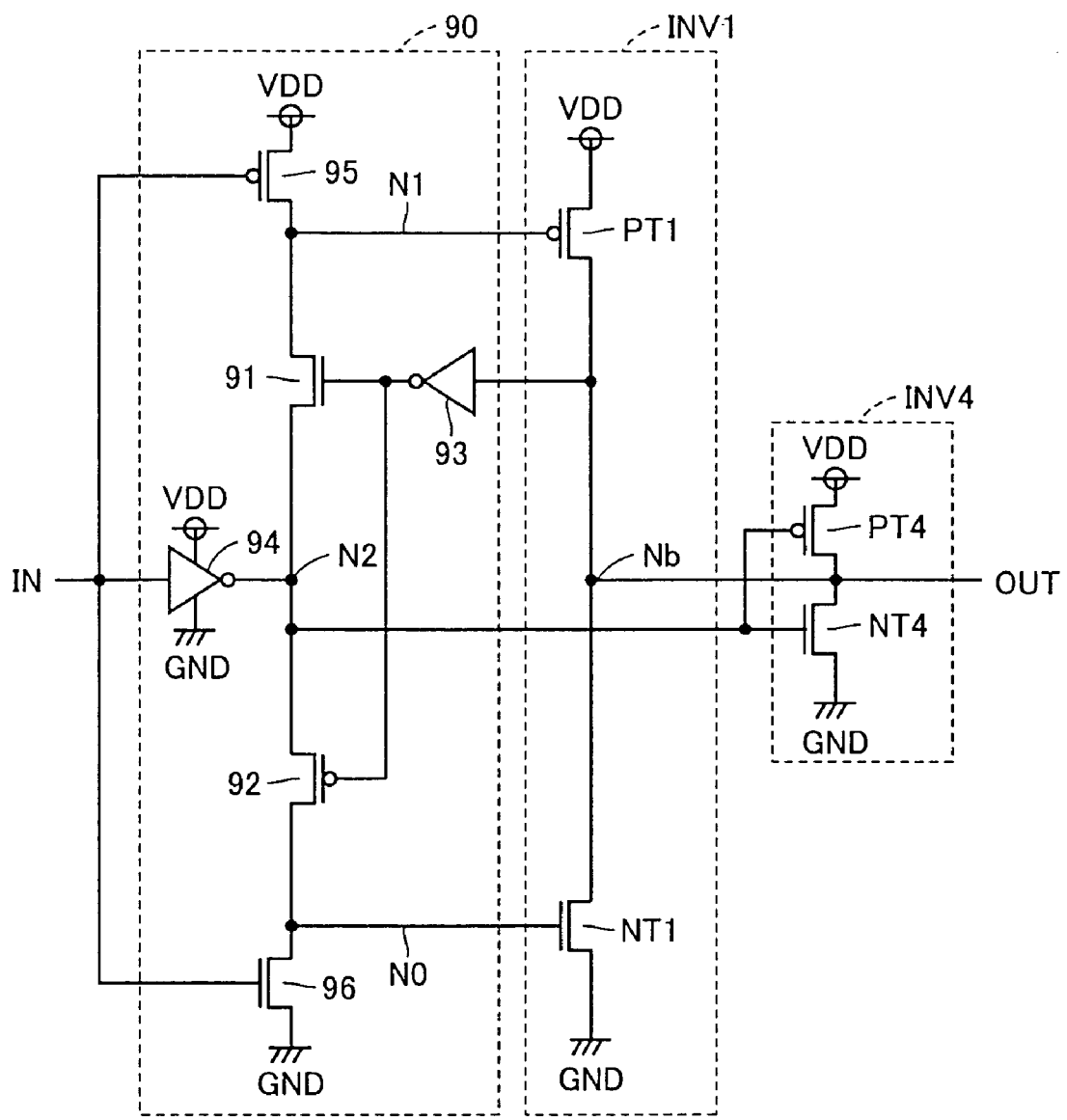
FIG. 23 is a circuit block diagram of a CMOS driver circuit according to a seventh embodiment of the present invention.

Referring to FIG. 23, a driver circuit 700 according to the seventh embodiment of the present invention includes inverters INV1 and INV4 and a control circuit 90.

Since inverter INV1 is equal to that described in the first embodiment, it will not be repeatedly described herein in detail.

Inverter INV4, which is connected to inverter INV1 through node Nb, is formed of transistors having a current driving force lower than that of inverter INV1. Specifically, inverter INV4 includes transistors PT4 and NT4.

Transistor PT4 is arranged between power supply voltage VDD and node Nb and the gate thereof is electrically coupled to node N2. Transistor NT4 is arranged between ground voltage GND and node Nb and the gate thereof is electrically coupled to node N2.

Control circuit 90 includes inverters 93 and 94, and transistors 91, 92, 95 and 96.

Transistor 95 is arranged between power supply voltage VDD and node N1 and the gate thereof receives the input of input signal IN. Transistor 91 is arranged between nodes N1 and N2 and the gate thereof receives the input of inverted signal at node Nb through inverter 93. Transistor 92 is arranged between nodes N2 and N0 and the gate thereof receives the input of inverted signal of the signal at node Nb through inverter 93. Transistor 96 is arranged between node N0 and ground voltage GND and the gate thereof receives input signal IN. Inverter 94 receives the input of input signal IN and transmits the inverted signal of input signal IN to node N2.

Figure 24:
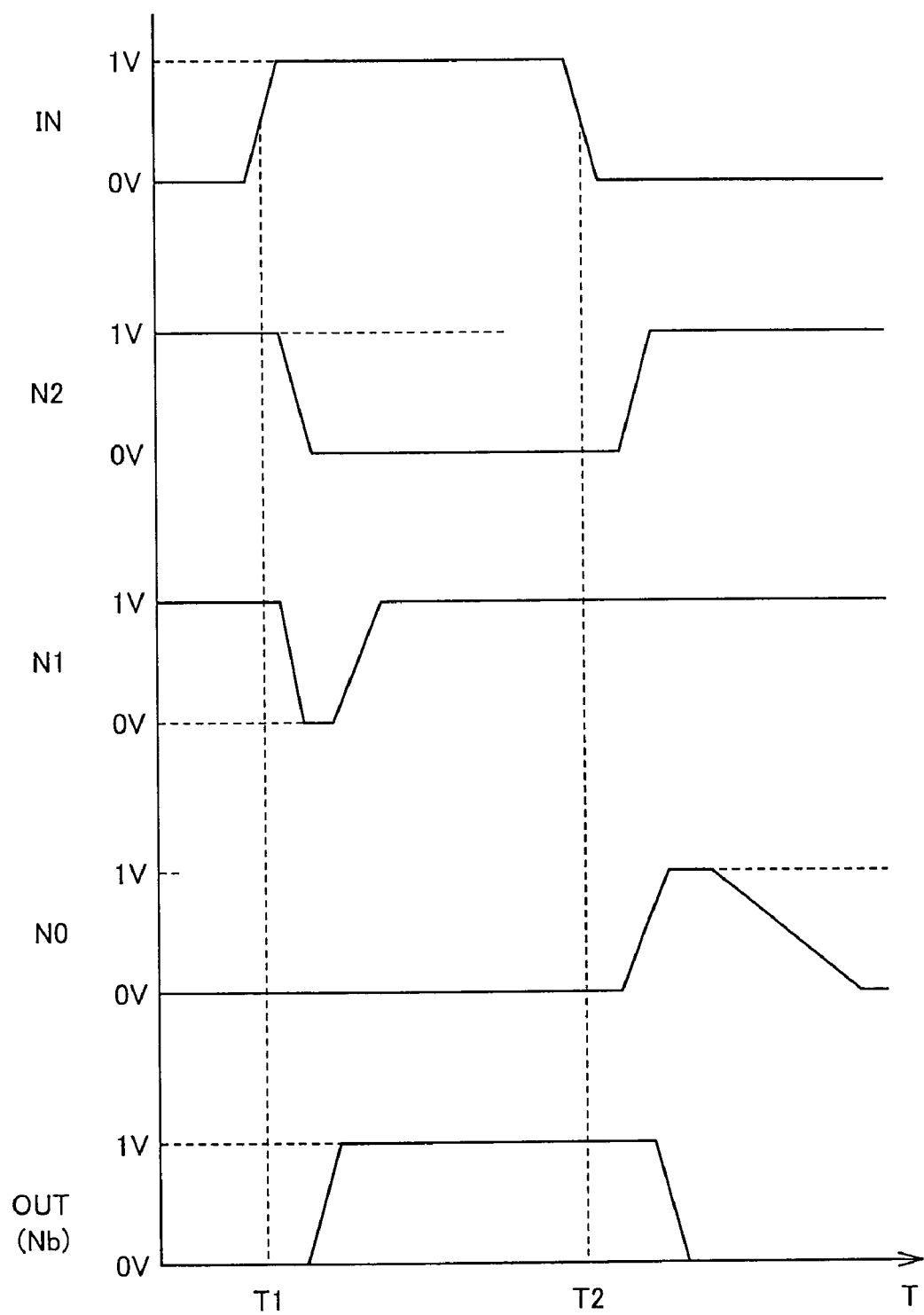
FIG. 24 is a timing chart showing the operation of the driver circuit according to the seventh embodiment of the present invention.

Referring to the timing chart of FIG. 24, the operation of driver circuit 700 according to the seventh embodiment of the present invention will be described.

In a stationary state in which input signal IN is 0 V, node Nb is set at 0 V. Therefore, inverter 93 of control circuit 90 turns on transistor 91 in response to the voltage level of node Nb. As a result, nodes N1 and N2 are electrically coupled to each other.

At time T1, when input signal IN changes from 0 V to 1V, inverter 94 of control circuit 90 sets node N2 at 0 V. Accordingly, inverter INV1 turns on transistor PT1 in response to the voltage level of node N2 to thereby electrically couple power supply voltage VDD to node Nb. That is, the voltage level of node Nb is set at 1 V. In addition, as the voltage level of node Nb is set at 1 V, inverter 93 of control circuit 90 turns off transistor 91 and turns on transistor 92. Therefore, nodes N2 and N0 are electrically coupled to each other. Accordingly, the supply of voltage to node N1 is stopped and transistor PT1 is turned off.

On the other hand, at time T1, transistor PT4 of inverter INV4 is turned on in response to the voltage level of node N2. Accordingly, node Nb is electrically coupled to power supply voltage VDD and set at 1 V.

Therefore, following the operations of transistors PT1 and PT4, node Nb is set at 1 V. In addition, transistor 96 of control circuit 90 is turned on in response to input signal IN (1 V) to electrically couple node N0 to ground voltage GND.

Next, a case where input signal IN changes from 1 V to 0 V at time T2 will be considered.

Inverter 94 of control circuit 90 sets node N2 at 1 V. As described above, transistor 92 is turned on and node N2 is electrically coupled to node N0. Therefore, transistor NT1 of inverter INV1 is turned on and node Nb is electrically coupled to ground voltage GND. Accordingly, the voltage level of node Nb is set at 0 V. As node Nb is set at 0 V, inverter 93 of control circuit 90 turns off transistor 92 and turns on transistor 91. As a result, node N2 is electrically coupled to node N1 as described above. The supply of voltage to node N0 is stopped and transistor NT1 is turned off, accordingly.

At time T2, transistor NT4 of inverter INV4 is turned on in response to the voltage level of node N2. Accordingly, node Nb is electrically coupled to ground voltage GND and set at 0 V.

Therefore, following the operation of transistors NT1 and NT4, node Nb is set at 0 V. In addition, transistor 95 of control circuit 90 is turned on in response to input signal IN (0 V) to electrically couple node N1 to power supply voltage VDD.

As described above, in the period in which input signal IN changes from 0 V to 1 V, both of transistors PT1 and PT4 are turned on. In the transition period in which output signal OUT changes from 0 V to 1 V, transistor PT1 having high operation rate is turned on for a predetermined period. Therefore, the rate of transistor PT1 is kept high. In a stationary period after output signal OUT is set at 1 V, node Nb is fixed to 1 V using transistor PT4.

That is, data level is changed at high rate temporarily using transistor PT1 having high leak current. In the stationary state, data level is fixed using the low-rate transistor having low leak current.

On the other hand, in the period in which input signal IN changes from 1 V to 0 V, both of transistors NT1 and NT4 are turned on. In the transition period in which output signal OUT changes from 1 V to 0 V, transistor NT1 having high operation rate is turned on for a predetermined period. Therefore, the rate of transistor NT1 is kept high. In a stationary period after output signal OUT is set at 0 V, node Nb is fixed to 0 V using transistor NT4.

That is, data level is changed at high rate temporarily using transistor NT1 having high leak current. In the stationary state, data level is fixed using the low-rate transistor having low leak current.

In this stationary period, nodes N0 and N1 turn into a floating state since the supply of voltage is stopped as described above. The voltage levels of nodes N0 and N1 are slowly changed by the gate leak of transistors NT1 and PT1, and transistors NT1 and PT1 are turned off.

Driver circuit 700 according to the seventh embodiment of the present invention has a configuration that two types of transistors having different current driving forces are provided on each of power supply voltage VDD side and ground voltage GND side. Accordingly, the high-rate operation of driver circuit 700 is further ensured. By setting the gate voltages of transistors NT1 and PT1 having high leak current at 0 V and 1 V, respectively while transistors NT1 and PT1 are inoperative, whereby it is possible to further decrease the leak currents of transistors NT1 and PT1 and eventually decrease the overall leak current of driver circuit 700.

Eighth Embodiment

In each of the sixth and seventh embodiments, the description has been given of the configuration that two types of transistors having different current driving forces are employed to ensure the high-rate operation of the driver circuit and to decrease power consumption.

In an eighth embodiment, description will be given of a configuration that the influence of external noise on output signal OUT is suppressed when the driver circuit is in a standby state, i.e., input signal IN is kept at 0V.

Figure 25:
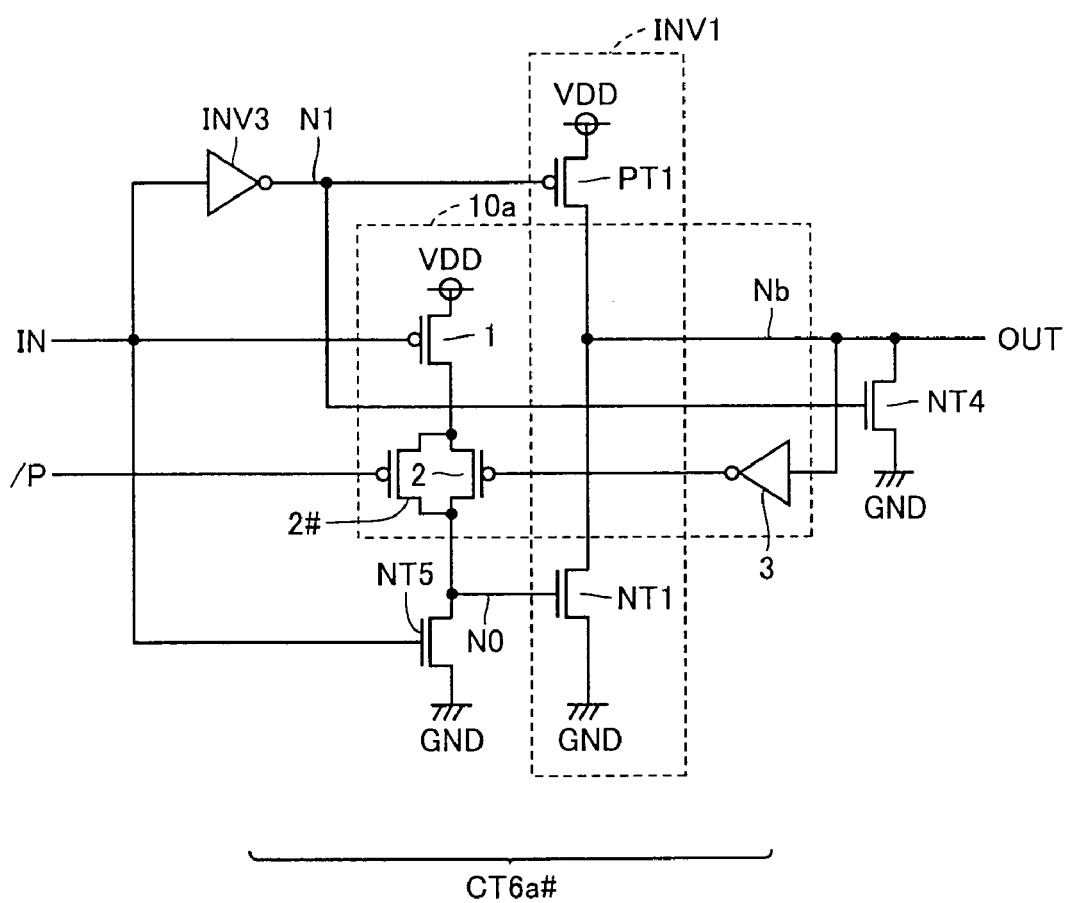
FIG. 25 is a schematic block diagram of a driver circuit according to an eighth embodiment of the present invention.

Referring to FIG. 25, a driver circuit 600a according to the eighth embodiment differs from driver circuit 600 shown in FIG. 16 in that timing circuit 10 is replaced by a timing circuit 10a. Since the other constituent elements of driver circuit 600a are equal to those of driver circuit 600, they will not be repeatedly described herein in detail.

Timing circuit 10a differs from timing circuit 10 in that a transistor 2# is newly provided. Since the other constituent elements of timing circuit 10a are equal to those of timing circuit 10, they will not be repeatedly described herein. Transistor 2# is arranged in parallel to transistor 2 between transistor 1 and node N0 and the gate thereof receives a control signal /P inputted from the outside of driver circuit 600a. It is assumed that transistor 2# is a P-channel MOS transistor. Inverter INV3 and timing circuit 10a constitute a control circuit CT6a# which controls the voltage levels of nodes N0 and N1. Transistor 2# constitutes a noise adjustment circuit.

In a standby state, driver circuit 600a according to the eighth embodiment receives the input of control signal /P (0 V). In states other than the standby state, driver circuit 600a receives the input of control signal /P (1 V). Since the operation of driver circuit 600a in this case is equal to that of driver circuit 600 according to the sixth embodiment, it will not be repeatedly described herein in detail.

Referring to the timing chart of FIG. 26, the operation of driver circuit 600a will be described.

Figure 26:
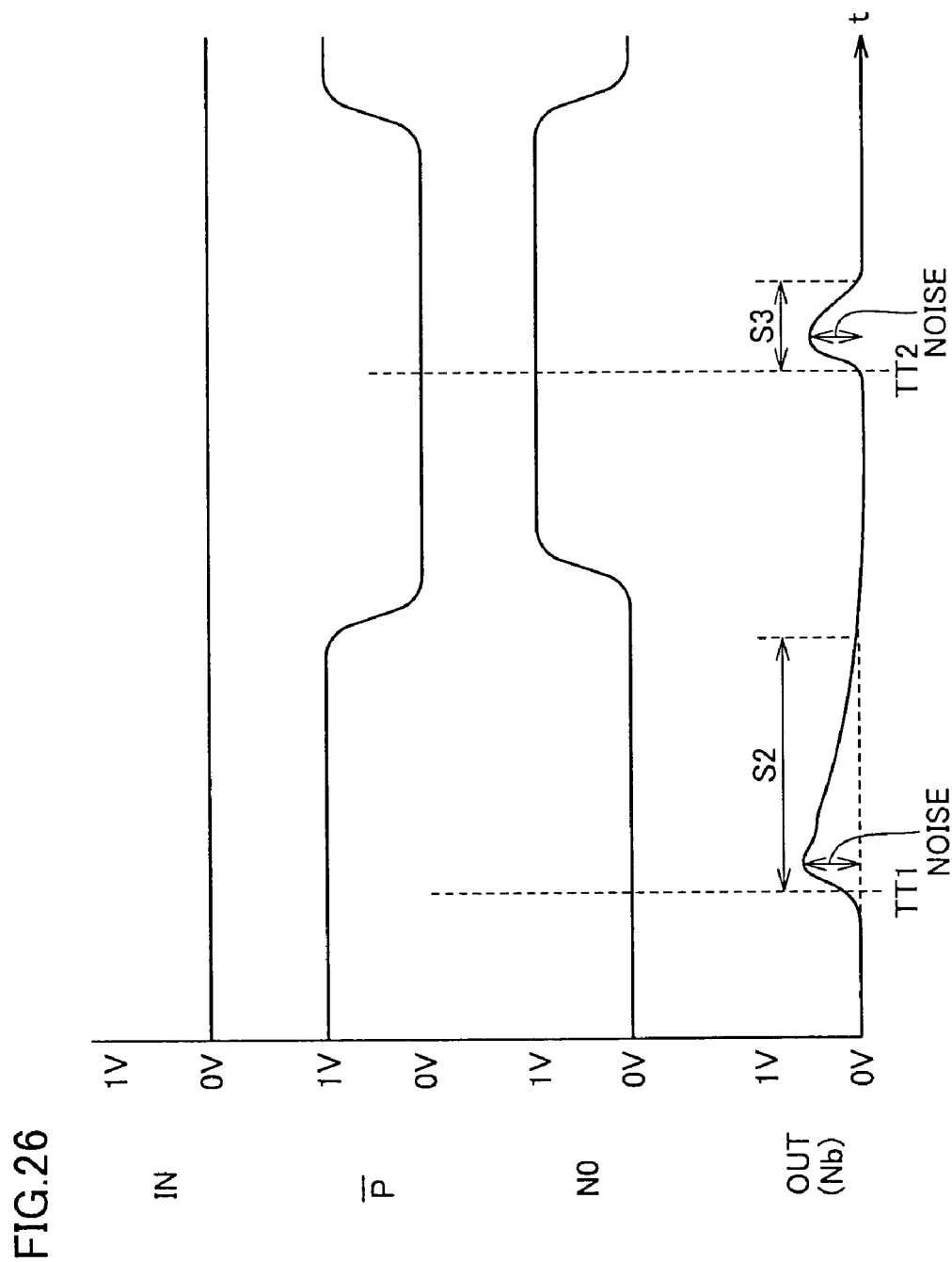
FIG. 26 is a timing chart showing the operation of the driver circuit according to the eighth embodiment of the present invention.

Referring to FIG. 26, a case where output signal OUT floats from 0 V due to the influence of noise at time TT1 at which driver circuit 600a is in a standby state will be considered. The noise is derived from, for example, the coupling capacitance of adjacent signal lines, not shown, if the voltage levels of the adjacent signal lines change. It is assumed herein that control signal /P is set at 0 V.

In this standby period, input signal IN is kept at 0 V. Node N1 is, therefore, set at 1 V and transistor NT4 having a low current driving force is kept to be turned on. Because of the low current driving force of transistor NT4, it takes a period S2 to eliminate the noise generated at time TT1.

In the eighth embodiment, in the standby state, control signal /P (0 V) is inputted from the outside. Herein, a case where output signal OUT floats from 0 V due to the influence of noise on output signal OUT at time TT2 will be considered. As control signal /P (0 V) is inputted, transistor 2# is turned on. Since input signal IN is set at 0 V, transistor 1 is turned on. As a result, as transistors 1 and #2 are turned on, power supply voltage VDD is electrically coupled to node N0 and node N0 is set at 1 V. Accordingly, transistor NT1 having a high current driving force is turned on. As a result, at time TT2, even when noise occurs to output signal OUT, the noise is eliminated in a period S1 shorter than period S2.

The configuration of driver circuit 600a according to the eighth embodiment can suppress the influence of externally applied noise on output signal OUT in the standby state.

Driver circuit 600a can be constituted at need so that control signal /P (at "L" level) to be inputted from the outside is inputted by a control circuit, not shown, for a predetermined period in which output signal OUT tends to be influenced by noise in the standby state. Alternatively, driver circuit 600a can be constituted so that control signal /P is inputted from the outside in a certain period.

First Modification of Eighth Embodiment

Figure 27:
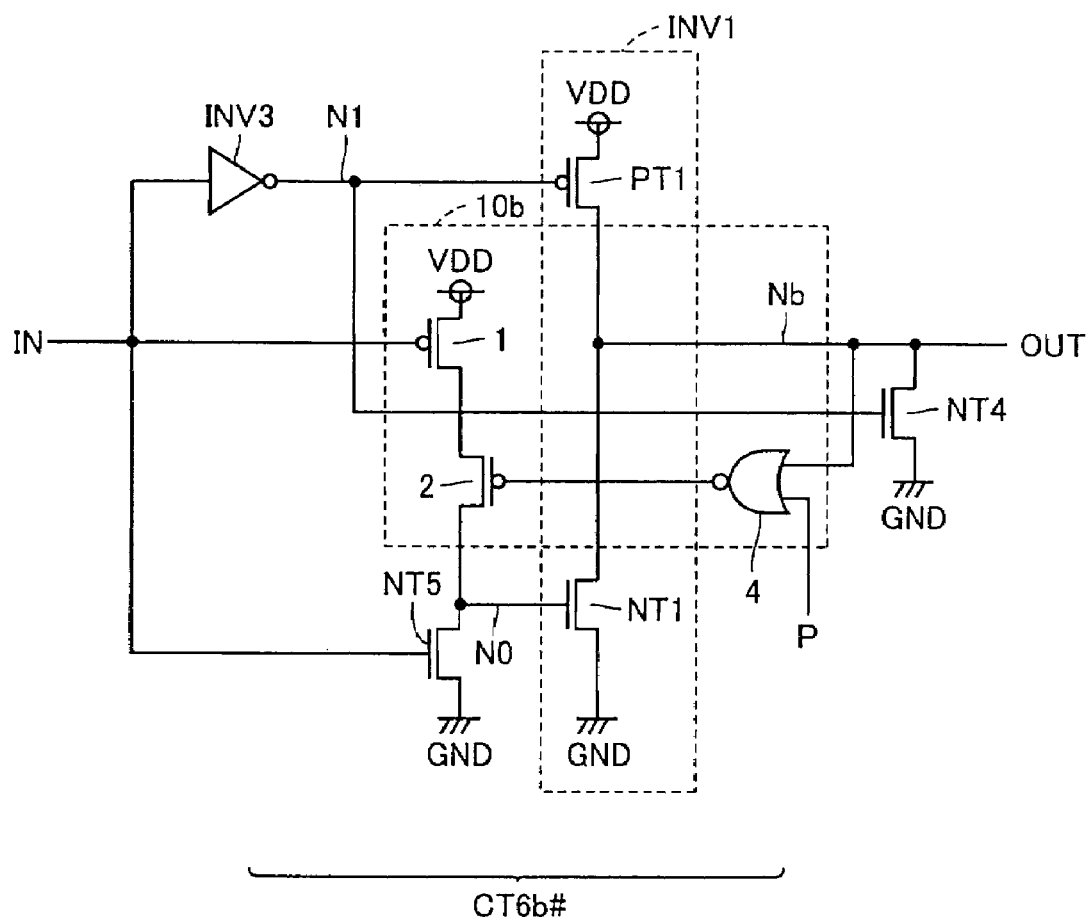
FIG. 27 is a schematic block diagram of a driver circuit according to a first modification of the eighth embodiment of the present invention.

Referring to FIG. 27, a driver circuit 600b according to a first modification of the eighth embodiment differs from driver circuit 600 shown in FIG. 16 in that timing circuit 10 is replaced by a timing circuit 10b. Since the other constituent elements of driver circuit 600b are equal to driver circuit 600, they will not be repeatedly described herein in detail.

Timing circuit 10b differs from timing circuit 10 in that inverter 3 is replaced by a NOR circuit 4. Since the other constituent elements of timing circuit 10b are equal to those of timing circuit 10, they will not be repeatedly described herein. NOR circuit 4 receives a signal outputted from output node Nb and control signal P which is the inverted signal of control signal /P, and outputs the NOR logic operation result between the two signals to the gate of transistor 2. Inverter INV3 and timing circuit 10b constitute a control circuit CT6b# which controls the voltage levels of nodes N0 and N1. NOR circuit 4 constitutes a noise adjustment circuit.

In a standby state, driver circuit 600b according to the first modification of the eighth embodiment receives the input of control signal P (1 V). In states other than the standby state, driver circuit 600b receives the input of control signal P (0 V). In this case, NOR circuit 4 operates similarly to inverter 3 and the operation of driver circuit 600b according to the first modification of the eighth embodiment is equal to that of driver circuit 600 according to the sixth embodiment, they will not be repeatedly described herein in detail.

In a standby state, as control signal P (1 V) is inputted, the output signal of NOR circuit 4 is set at 1 V. Transistor 2 is turned on, accordingly. Since input signal IN is set at 0 V in the standby state, transistors 1 and 2 are turned on. In the standby state, since input signal IN is at 0 V, transistors 1 and 2 are turned on. As a result, power supply voltage VDD is electrically coupled to node N0 and node N0 is set at 1 V. Transistor NT1 having a high current driving force is, therefore, turned on.

Thus, driver circuit 600b executes the same operation as that of driver circuit 600a according to the eighth embodiment. That is, with the configuration of driver circuit 600b according to the first modification of the eighth embodiment, it is possible to suppress the influence of externally applied noise on output signal OUT in the standby state.

It is noted that the configuration of the driver circuit described in each of the eighth embodiment and the first modification thereof can be also applied to the driver circuits described in the modifications of the sixth embodiment.

Second Modification of Eighth Embodiment

In the second modification of the eighth embodiment, description will be given of a configuration that the influence of noise is suppressed when an output signal tends to be influenced by the noise, i.e., when a plurality of driver circuits are arranged adjacent each other.

Figure 28:
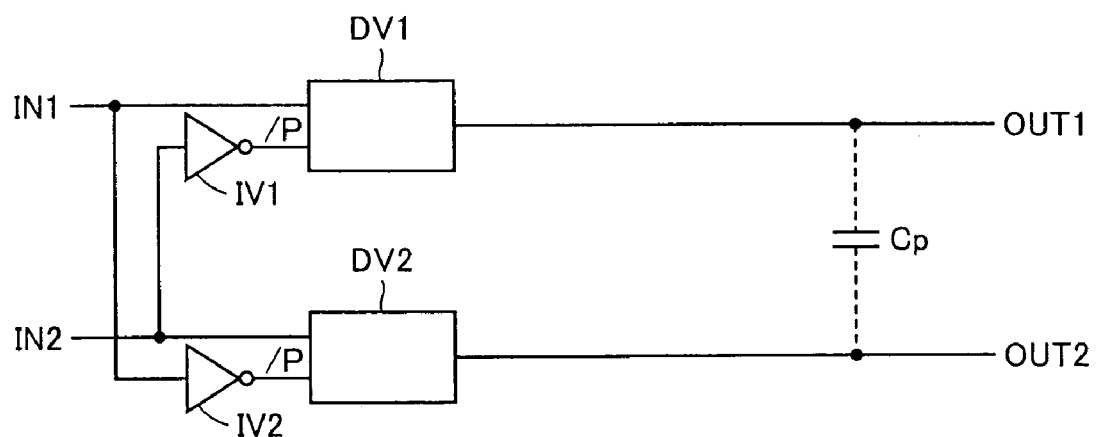
FIG. 28 is a schematic block diagram of driver circuits arranged adjacent each other.

Referring to FIG. 28, a driver circuit DV1 sets an output signal OUT1 in response to input signal IN1. Driver circuit DV2 sets an output signal OUT2 in response to input signal IN2. An inverter IV1 inverts input signal IN2 and inputs the inverted signal as control signal /P to driver circuit DV1. An inverter IV2 inverts input signal IN1 and inputs the inverted signal as control signal /P to driver circuit DV2. It is noted that a capacitor Cp shown in FIG. 28 is a coupling capacitance generated between signal lines which transmit output signals OUT1 and OUT2 of driver circuits DV1 and DV2, respectively.

By way of example, each of driver circuits DV1 and DV2 corresponds to driver circuit 600a described in the eighth embodiment.

Figure 29:
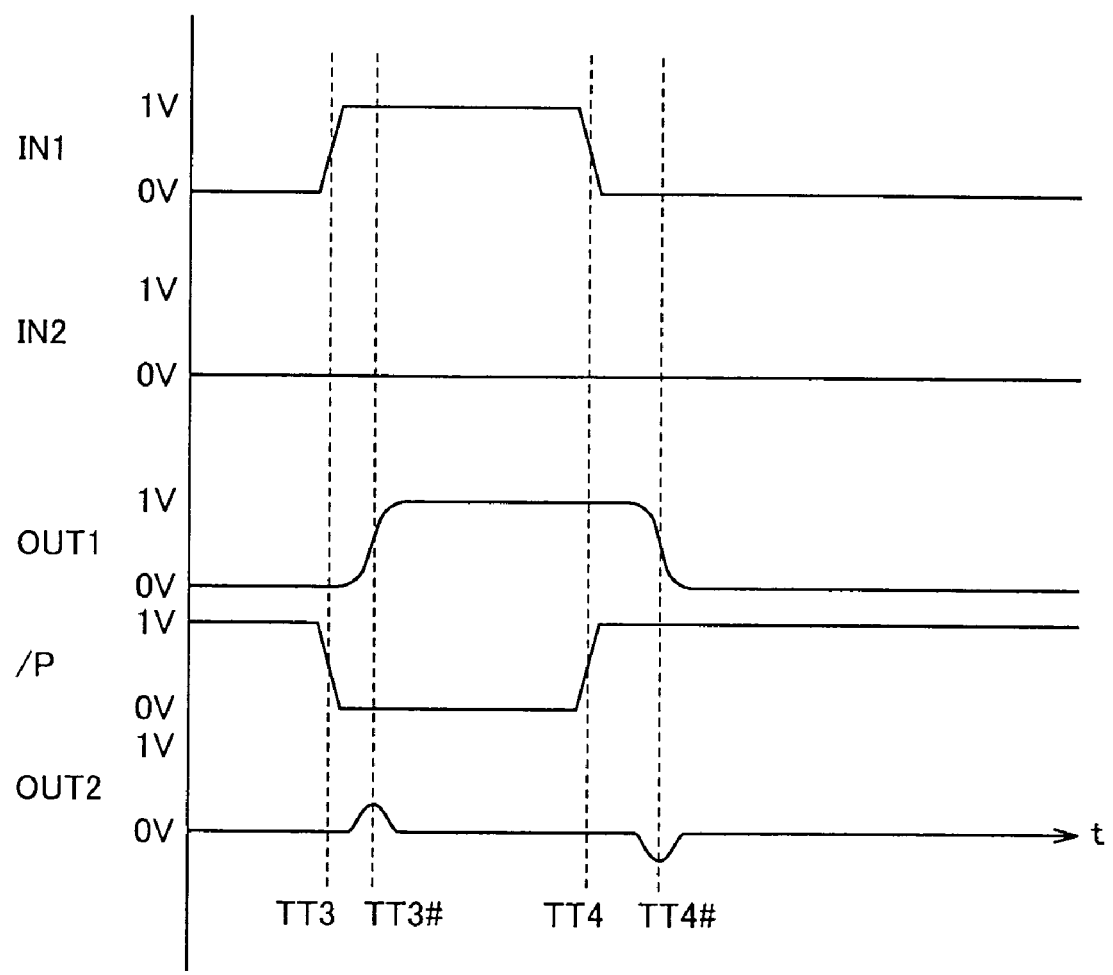
FIG. 29 is a timing chart when the driver circuits shown in FIG. 28 operate.

A case where driver circuit DV1 operates will be described with reference to the timing chart of FIG. 29. It is assumed herein that driver circuit DV2 is in a standby state.

At time TT3, when input signal IN1 is set at 1 V, driver circuit DV1 operates similarly to driver circuit 600a and sets output signal OUT1 at 1 V.

Since input signal IN1 of adjacent driver circuit DV2 is set at 0 V, output signal OUT2 of driver circuit DV2 is 0 V.

At time TT3#, as output signal OUT1 is set at 1 V, noise floating from 0 V due to the coupling capacitance generates to the signal line which transmits output signal OUT2.

At this moment, control signal /P of driver circuit DV2 is set at 0 V in response to the setting of input signal IN1 (at 1V). Similarly to the eighth embodiment, therefore, following the setting of control signal /P (at 0 V), transistor NT1 having a high current driving force is turned on. The noise which generates to output signal OUT2 is eliminated, accordingly.

At time TT4, input signal IN1 inputted to driver circuit DV1 is set at 0 V.

At time TT4#, output signal OUT1 of driver circuit DV1 is set at 0 V.

At time TT4#, as output signal OUT1 is set at 0 V, noise that is slightly lower than 0 V generates to the signal line which transmits output signal OUT2 due to the coupling noise. In this case, since the signal lines which transmit output signals OUT1 and OUT2 are both set at 0 V, the noise levels of the signal lines are low and the noise can be, therefore, sufficiently eliminated by turning on transistor NT4 having a low current driving force.

Therefore, even when a plurality of driver circuits are arranged adjacent each other, i.e., even in a situation in which noise tends to generate, it is possible to sufficiently suppress the influence of the noise due to the configuration according to the second modification of the eighth embodiment.

Figure 30:
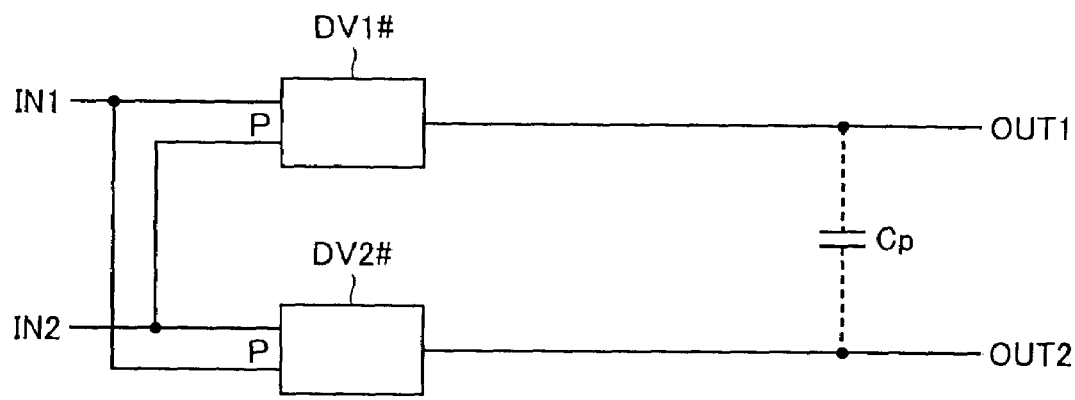
FIG. 30 is a schematic block diagram of another example of driver circuits arranged adjacent each other
Figure 31:
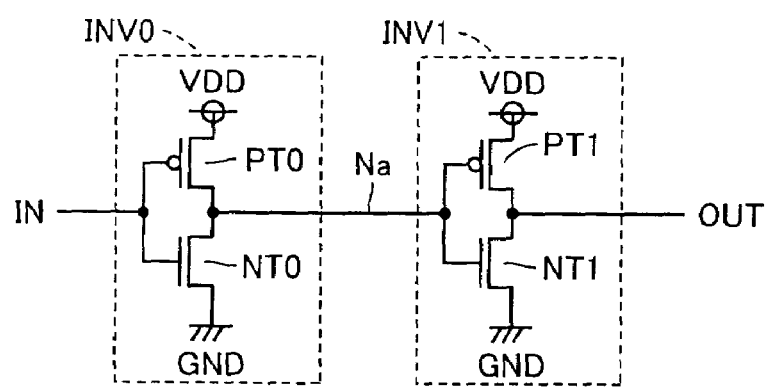
FIG. 31 is a circuit block diagram of a conventional CMOS driver circuit in which an input signal is propagated to an internal circuit.
Figure 32:
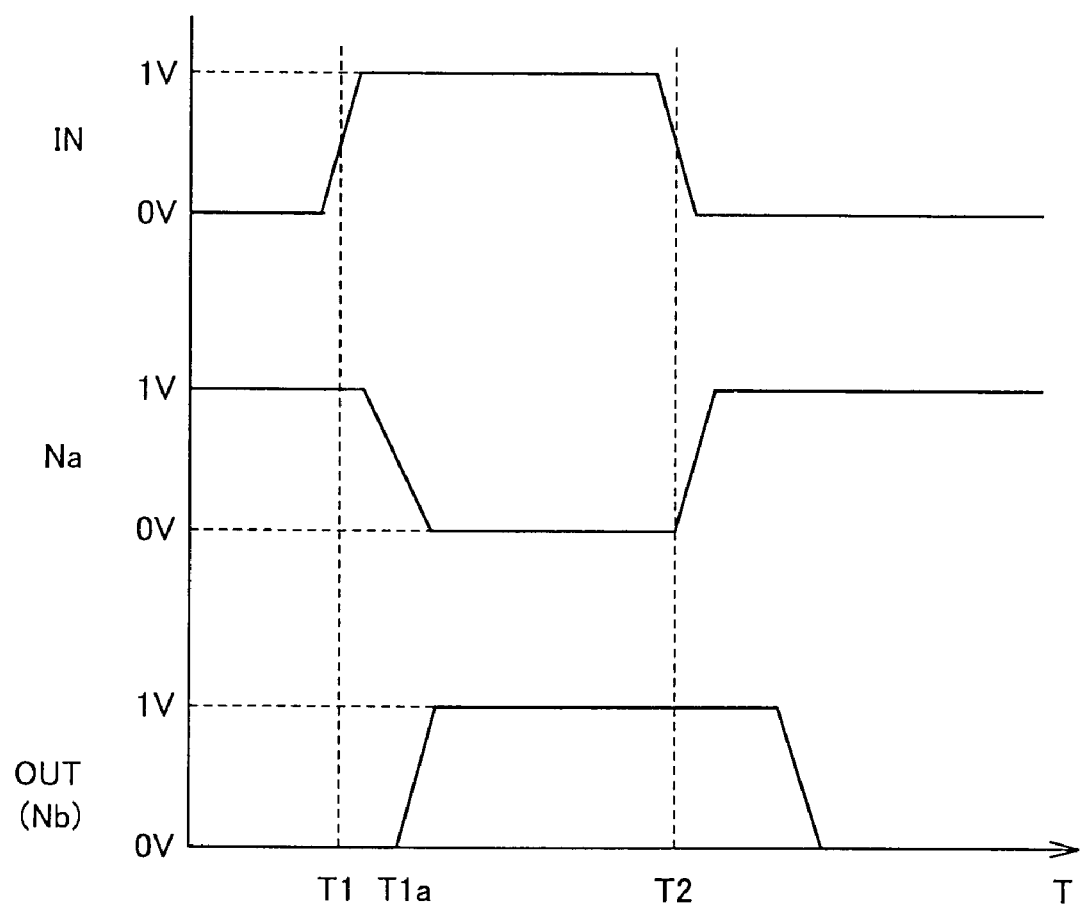
FIG. 32 is a timing chart showing the operation of a conventional CMOS driver circuit.
Figure 33:
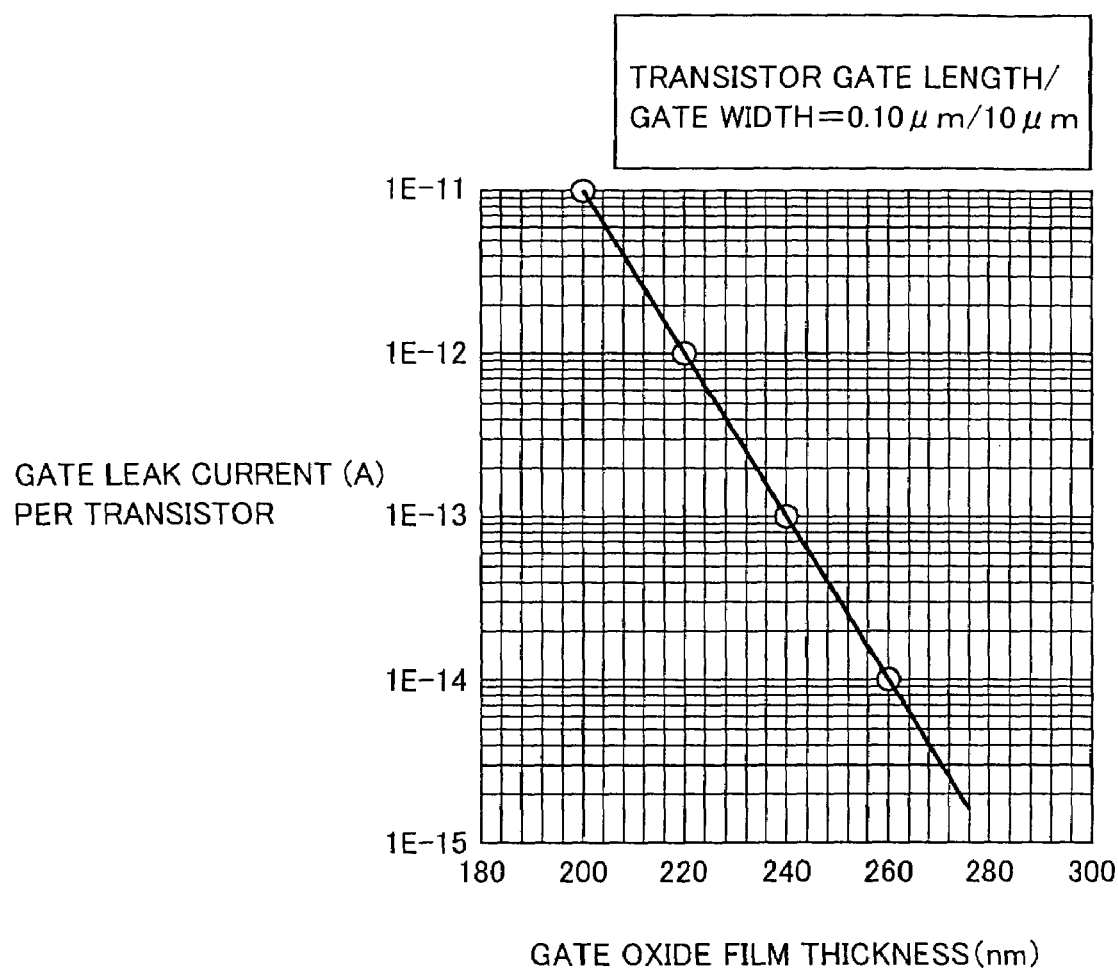
FIG. 33 shows the relationship between the thickness of a gate oxide film and a gate leak current per transistor.

Referring to FIG. 30, a driver circuit DV1# sets output signal OUT1 in response to input signal IN1. A driver circuit DV2# sets output signal OUT2 in response to input signal IN2. By way of example, each of driver circuits DV1# and DV2# corresponds to driver circuit 600b according to the first modification of the eighth embodiment. Input signal IN2 is input as control signal P to driver circuit DV1#. Input signal IN1 is inputted as control signal P to driver circuit DV2#. It is noted that capacitor Cp shown in FIG. 30 is a coupling capacitance generated between signal lines which transmit output signals OUT1 and OUT2 of driver circuits DV1# and DV2#, respectively.

The operations of driver circuit DV1# and DV2# are equal to that described with reference to the timing chart of FIG. 29. Specifically, as input signal IN1 (IN2) of one of the driver circuits is set at 1 V, noise may generate to output signal OUT2 (OUT1) of the other driver circuit. In this case, as input signal IN1 (IN2) of one of the driver circuits is set at 1 V, control signal P (1 V) is inputted to the other driver circuit.

Accordingly, the driver circuits operate similarly to a case where control signal P is inputted to driver circuit 600b according to the first modification of the eighth embodiment, thus eliminating the generated noise.

Even when a plurality of driver circuits are arranged adjacent each other, i.e., noise tends to generate, it is possible to sufficiently suppress the influence of the noise due to the configuration shown in FIG. 30 according to the second modification of the eighth embodiment.

In the second modification of the eighth embodiment, the description has been given of the configuration of suppressing the influence of noise by employing two driver circuits 600a or 600b. The configuration described in each of the eighth embodiment and the first modification thereof can be also applied to the configuration for the driver circuit described in the modifications of the sixth embodiment.

As for the driver circuits according to the above embodiments, an increase of the gate leak current by making the gate oxide film thin has been described. As for such a transistor as transistor NT1 which is required to have high operation rate, it is necessary to make the gate oxide film thin. However, it is unnecessary to do so for the other transistors which are not required to have high operation rate. Therefore, by making the gate oxide films of only transistors NT1 and PT1 thin and setting those of the other transistors to have ordinary thicknesses, it is possible to decrease the overall gate leak current of the transistors. Specifically, transistors NT1 and PT1 can be manufactured by separating the step of making the gate oxide film thin from that for the other transistors.

Moreover, it is possible to increase field intensity by employing a gate oxide film which has a high dielectric constant, i.e., a so-called high dielectric gate oxide, as compared with a case of employing a gate oxide film made of silicon dioxide. That is, it is possible to realize a transistor which operates at high rate by employing a high dielectric gate oxide film.

Accordingly, even when gate voltage is not temporarily raised while the gate oxide film is made thin, it is possible to realize a high-rate transistor having the same performance as that described above. In other words, it is possible to eventually decrease gate leak current by employing such high dielectric gate oxide films in, for example, transistors NT1 and PT1.

Although the present invention has been described and illustrated in detail, it is clearly understood that the same is by way of illustration and example only and is not to be taken by way of limitation, the spirit and scope of the present invention being limited only by the terms of the appended claims.

The invention claimed is:

1. A semiconductor device comprising a driver circuit for supplying a voltage at an output node in accordance with an input signal received at an input node, said driver circuit including:
    a first transistor connected between a first voltage and the output node, and turned on and off in accordance with voltage level of a first internal node;
    a second transistor connected between the output node and a second voltage, and turned on and off in accordance with voltage level of a second internal node;
    a third transistor connected in parallel with said second transistor, between the output node and the second voltage, and turned on and off, complementarily to said first transistor, in accordance with the voltage level of the first internal node;
    a control circuit for controlling voltages of the first and second internal nodes to complementarily turn on said first transistor and said second and third transistors in accordance with the input signal; and a fourth transistor connected between the second voltage and the second internal node, wherein
said control circuit sets one of the first and second voltages for turning on said second and third transistors, turns off said first transistor when said second and third transistors are turned on, and supplies the one of the first and second voltages to the second internal node for a predetermined period,
said second transistor has a driving force for supplying the second voltage to the output node and higher than a driving force of said third transistor,
said fourth transistor is turned on when said first transistor turns on, and
said first, second, third, and fourth transistors are field-effect transistors having respective gate oxide films, and the gate oxide film of said fourth field-effect transistor has a dielectric constant different from dielectric constant of said gate oxide film of at least one of said first, second, and third transistors.

2. The semiconductor device according to claim 1, wherein said control circuit includes a timing circuit connected to the second internal node and adjusting the predetermined period in accordance with the voltage level of the output node.

3. The semiconductor device according to claim 1, wherein said control circuit includes a connection circuit for electrically connecting the first internal node to the second internal node for the predetermined period.

4. The semiconductor device according to claim 1, wherein
the input signal includes a plurality of signals, and
said control circuit controls the voltages of the first and second internal nodes in accordance with a logic operation result, based on the plurality of signals.

5. The semiconductor device according to claim 2, wherein said timing circuit includes a noise adjustment circuit for supplying the one of the first and second voltages for turning on said second and third transistors to the second internal node in response to an external instruction in a standby state.

6. The semiconductor device according to claim 1, wherein said timing circuit includes fifth and sixth transistors connected in series between the first voltage and the second internal node.

7. The semiconductor device according to claim 6, wherein said timing circuit includes an inverter, said fifth transistor has a control terminal connected to the input node, and said sixth transistor has a control terminal coupled to the output node through said inverter.

8. The semiconductor device according to claim 5, wherein
said timing circuit includes fifth and sixth transistors connected in series between the first voltage and the second internal node, and
said noise adjustment circuit comprises a seventh transistor connected in parallel with said sixth transistor and having a control terminal for receiving the external instruction.

* * * * *